(12) United States Patent
Hou et al.

(10) Patent No.: US 11,003,074 B2
(45) Date of Patent: May 11, 2021

(54) PATTERN FORMATION METHODS AND PHOTORESIST PATTERN OVERCOAT COMPOSITIONS

(71) Applicant: Rohm and Haas Electronic Materials LLC, Marlborough, MA (US)

(72) Inventors: Xisen Hou, Lebanon, NH (US); Cong Liu, Shrewsbury, MA (US); Irvinder Kaur, Northborough, MA (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 182 days.

(21) Appl. No.: 15/960,825

(22) Filed: Apr. 24, 2018

(65) Prior Publication Data

US 2018/0314155 A1 Nov. 1, 2018

Related U.S. Application Data

(60) Provisional application No. 62/492,943, filed on May 1, 2017.

(51) Int. Cl.

| | | |
|---|---|---|
| *G03F 7/11* | (2006.01) | |
| *G03F 7/40* | (2006.01) | |
| *G03F 7/16* | (2006.01) | |
| *G03F 7/00* | (2006.01) | |
| *C08F 220/68* | (2006.01) | |
| *H01L 21/027* | (2006.01) | |
| *C09D 133/16* | (2006.01) | |
| *C09D 133/02* | (2006.01) | |
| *G03F 7/039* | (2006.01) | |
| *G03F 7/004* | (2006.01) | |
| *C08F 212/14* | (2006.01) | |

(52) U.S. Cl.
CPC .......... *G03F 7/0035* (2013.01); *C08F 212/14* (2013.01); *C08F 220/68* (2013.01); *C09D 133/02* (2013.01); *C09D 133/16* (2013.01); *G03F 7/0048* (2013.01); *G03F 7/039* (2013.01); *G03F 7/11* (2013.01); *G03F 7/168* (2013.01); *G03F 7/40* (2013.01); *G03F 7/405* (2013.01); *H01L 21/0274* (2013.01)

(58) Field of Classification Search
CPC . G03F 7/11; G03F 7/40; G03F 7/0048; G03F 7/0035

See application file for complete search history.

(56) References Cited

U.S. PATENT DOCUMENTS

| | | | |
|---|---|---|---|
| 6,379,860 B1 * | 4/2002 | Fujimori | G03F 7/0392 430/270.1 |
| 10,162,266 B2 * | 12/2018 | Pohlers | G03F 7/405 |
| 10,241,411 B2 * | 3/2019 | Kaur | G03F 7/11 |
| 2009/0136878 A1 | 5/2009 | Kanna | |
| 2009/0311490 A1 | 12/2009 | Burns et al. | |
| 2013/0171574 A1 | 7/2013 | Xu | |
| 2013/0171825 A1 | 7/2013 | Xu | |
| 2014/0186772 A1 | 7/2014 | Pohlers et al. | |
| 2015/0214056 A1 * | 7/2015 | Xu | G03F 7/405 438/514 |
| 2015/0323869 A1 * | 11/2015 | Liu | C09D 133/14 430/273.1 |
| 2016/0124312 A1 | 5/2016 | Hatakeyama et al. | |
| 2016/0130462 A1 | 5/2016 | Liu et al. | |
| 2016/0139512 A1 | 5/2016 | Hatakeyama et al. | |
| 2016/0187783 A1 | 6/2016 | Kaur et al. | |
| 2017/0255102 A1 | 9/2017 | Rowell et al. | |
| 2017/0255103 A1 | 9/2017 | Rowell et al. | |

FOREIGN PATENT DOCUMENTS

| | | |
|---|---|---|
| JP | 2012037867 A | 2/2012 |
| JP | 2013-218191 A | 10/2013 |

OTHER PUBLICATIONS

Search report for corresponding China Application No. 201810586411.1 dated Dec. 26, 2019.
Search report for corresponding China Application No. 201310396587.0 dated Dec. 19, 2020.

* cited by examiner

*Primary Examiner* — John S Chu
(74) *Attorney, Agent, or Firm* — Jonathan Baskin; Theresa Falcone

(57) ABSTRACT

A pattern formation method, comprising: (a) providing a semiconductor substrate; (b) forming a photoresist pattern over the semiconductor substrate, wherein the photoresist pattern is formed from a photoresist composition comprising: a first polymer comprising acid labile groups; and a photoacid generator; (c) coating a pattern overcoat composition over the photoresist pattern, wherein the pattern overcoat composition comprises a second polymer and an organic solvent, wherein the organic solvent comprises one or more ester solvents, wherein the ester solvent is of the formula $R_1$—C(O)O—$R_2$, wherein $R_1$ is a C3-C6 alkyl group and $R_2$ is a C5-C10 alkyl group; (d) baking the coated photoresist pattern; and (e) rinsing the coated photoresist pattern with a rinsing agent to remove the second polymer. The methods find particular applicability in the manufacture of semiconductor devices.

8 Claims, 1 Drawing Sheet

PATTERN FORMATION METHODS AND PHOTORESIST PATTERN OVERCOAT COMPOSITIONS

This application claims the benefit of priority under 35 U.S.C. § 119(e) to U.S. Provisional Application No. 62/492,943, filed May 1, 2017, the entire contents of which are incorporated herein by reference.

BACKGROUND

The invention relates generally to the manufacture of electronic devices. More specifically, this invention relates to pattern formation methods and to photoresist pattern overcoat compositions useful in the formation of fine lithographic patterns.

In the semiconductor manufacturing industry, photoresist materials are used for transferring an image to one or more underlying layers, such as metal, semiconductor and dielectric layers, disposed on a semiconductor substrate, as well as to the substrate itself. To increase the integration density of semiconductor devices and allow for the formation of structures having dimensions in the nanometer range, photoresists and photolithography processing tools having high-resolution capabilities have been and continue to be developed.

Positive-tone chemically amplified photoresists are conventionally used for high-resolution processing. Such resists typically employ a resin having acid-labile leaving groups and a photoacid generator. Patternwise exposure to activating radiation through a photomask causes the acid generator to form an acid which, during post-exposure baking, causes cleavage of the acid-labile groups in exposed regions of the resin. This creates a difference in solubility characteristics between exposed and unexposed regions of the resist in an aqueous alkaline developer solution. In a positive tone development (PTD) process, exposed regions of the resist are soluble in the aqueous alkaline developer and are removed from the substrate surface, whereas unexposed regions, which are insoluble in the developer, remain after development to form a positive image.

Lithographic scaling has conventionally been achieved by increasing the numerical aperture of the optical exposure equipment and using shorter exposure wavelengths. At present, ArF (193 nm) lithography is the standard for mass production of advanced semiconductor devices. ArF photoresist polymers are typically based on (meth)acrylate chemistry and are free or substantially free of aromatic groups in the polymer due to their high absorption at the exposure wavelength. To form finer photoresist patterns than attainable by direct imaging alone, photoresist pattern trimming processes have been proposed, for example, in US2014/0186772A1. Photoresist trimming processes typically involve contacting a photoresist pattern that includes a polymer having acid labile groups with a composition containing an acid or thermal acid generator. The acid or generated acid causes deprotection in a surface region of the resist pattern, which region is then removed, for example, by contact with a developer solution. This allows for trimming of the photoresist pattern, for example, resulting in the creation of finer resist line and pillar patterns, or larger diameter contact hole patterns, than when using direct imaging alone.

To form finer device geometries than possible with Arf lithography, EUV (e.g., 13.5 nm) lithography methods and materials have been and continue to be developed for next-generation semiconductor devices. An advantage of this technology is the lack of absorption of EUV radiation by aromatic groups, thereby opening up the possibility for use of photoresist material platforms not practical for ArF lithography, for example, vinyl aromatic-based polymers such as polyhydroxystyrene (PHS)-based polymers. Such materials can be beneficial, for example, from the standpoint of one or more of etch resistance, etch selectivity, sensitivity and cost. The use of ArF resist pattern trimming products with aromatic-based photoresist polymer systems, however, has been found to result in poor patterning performance, for example, in local critical dimension uniformity (LCDU), coating defects and pattern damage.

There is a need in the art for photoresist pattern formation methods and resist pattern overcoat compositions useful in electronic device fabrication that address one or more problems associated with the state of the art.

SUMMARY OF THE INVENTION

In accordance with a first aspect of the invention, pattern formation methods are provided. The methods comprise: (a) providing a semiconductor substrate; (b) forming a photoresist pattern over the semiconductor substrate, wherein the photoresist pattern is formed from a photoresist composition comprising: a first polymer comprising acid labile groups; and a photoacid generator; (c) coating a pattern overcoat composition over the photoresist pattern, wherein the pattern overcoat composition comprises a second polymer and an organic solvent, wherein the organic solvent comprises one or more ester solvents, wherein the ester solvent is of the formula $R_1$—C(O)O—$R_2$, wherein $R_1$ is a C3-C6 alkyl group and $R_2$ is a C5-C10 alkyl group; (d) baking the coated photoresist pattern; and (e) rinsing the coated photoresist pattern with a rinsing agent to remove the second polymer.

Also provided are photoresist pattern overcoat compositions. The compositions comprise: a matrix polymer comprising a repeat unit comprising a —C(CF$_3$)$_2$OH group and/or a repeat unit comprising an acid group; and an organic solvent comprising one or more ester solvents, wherein the ester solvent is of the formula $R_1$—C(O)O—$R_2$, wherein $R_1$ is a C3-C6 alkyl group and $R_2$ is a C5-C10 alkyl group.

Also provided are coated substrates. The coated substrates comprising: a semiconductor substrate; a photoresist pattern over the substrate; and a photoresist pattern overcoat composition as described herein over and in contact with the photoresist pattern.

Preferable methods and compositions of the invention can provide photoresist patterns having improved characteristics, for example, in one or more of local CD uniformity (LCDU), coating defectivity and resist dimension reduction.

The terminology used herein is for the purpose of describing particular embodiments only and is not intended to be limiting of the invention. The singular forms "a", "an" and "the" are intended to include singular and plural forms, unless the context indicates otherwise.

DESCRIPTION OF THE DRAWINGS

The present invention will be described with reference to the following drawing, in which like reference numerals denote like features, and in which.

DETAILED DESCRIPTION

Photoresist Pattern Overcoat Compositions

Figure 1A:
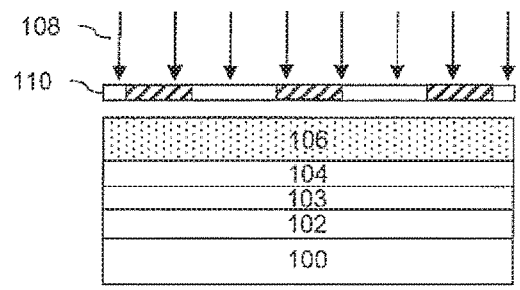
FIG. 1A-H illustrates an exemplary process flow for forming a photolithographic pattern in accordance with the invention.

Photoresist pattern overcoat compositions of the invention include a polymer and a solvent, and can include one or more optional additional components. The polymer allows for the compositions to be coated over the photoresist pattern in the form of a layer having a desired thickness. The polymer should have good solubility in the rinsing agent to be used in the patterning process. For example, the matrix polymer can be soluble in an aqueous alkaline solution such as those typically used as photoresist developers, preferably aqueous quaternary ammonium hydroxide solutions such as aqueous tetramethylammonium hydroxide (TMAH) (e.g., a 0.26N TMAH solution). To minimize residue defects originating from the pattern overcoat composition, the dissolution rate of a dried layer of the overcoat composition in a rinsing agent to be applied should be greater than that of the photoresist pattern in the rinsing agent. The matrix polymer typically exhibits a dissolution rate in the rinsing agent, preferably a 0.26N TMAH solution, of 100 Å/second or higher, preferably 1000 Å/second or higher. The matrix polymer should be soluble in the solvent of the overcoat composition, described herein.

The matrix polymer can be formed from one or more monomers chosen, for example, from those having an ethylenically unsaturated polymerizable double bond, such as: (meth)acrylate monomers such as isopropyl(meth)acrylate and n-butyl(meth)acrylate; (meth)acrylic acid; vinyl aromatic monomers such as styrene, hydroxystyrene and acenaphthylene; vinyl alcohol; vinyl chloride; vinyl pyrrolidone; vinyl pyridine; vinyl amine; vinyl acetal; and combinations thereof. Preferably, the matrix polymer contains one or more functional groups chosen, for example, from hydroxyl, acid groups such as carboxyl, sulfonic acid and sulfonamide, silanol, fluoroalcohol such as hexafluoroisopropyl alcohol [—C(CF$_3$)$_2$OH], anhydrates, lactones, esters, ethers, allylamine, pyrrolidones and combinations thereof. Of these, —C(CF$_3$)$_2$OH and acid groups such as carboxyl, sulfonic acid and sulfonamide are particularly preferred. The matrix polymer can be a homopolymer or a copolymer having a plurality of distinct repeat units, for example, two, three, four or more distinct repeat units. In one aspect, the repeat units of the matrix polymer are all formed from (meth)acrylate monomers, are all formed from (vinyl)aromatic monomers or are all formed from (meth)acrylate monomers and (vinyl)aromatic monomers. When the matrix polymer includes more than one type of repeat unit, it typically takes the form of a random copolymer. Suitable matrix polymers in accordance with the invention include, for example, the following:

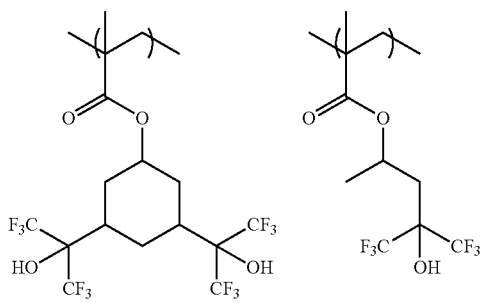

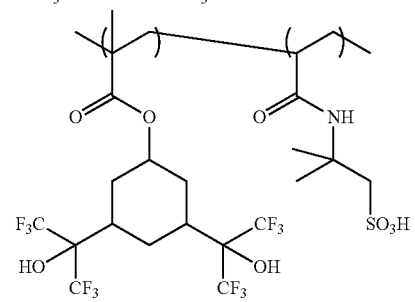

-continued

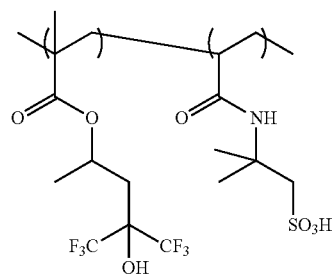

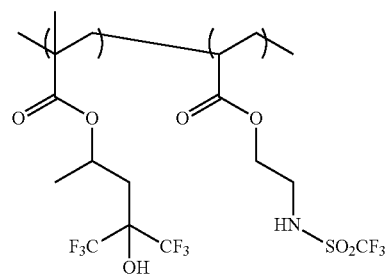

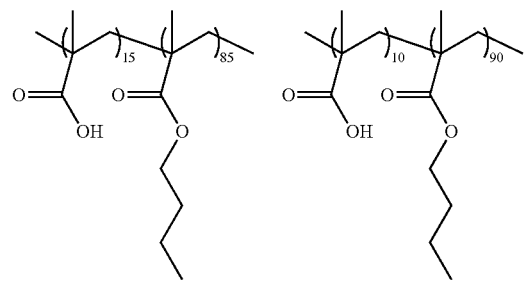

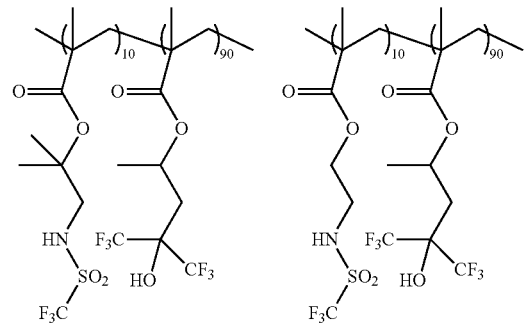

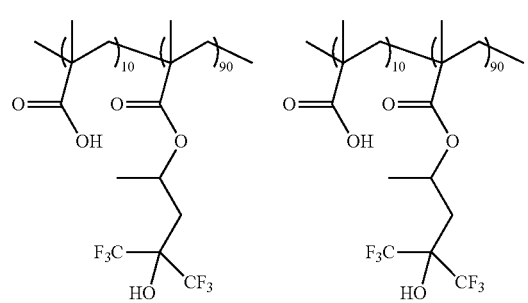

-continued
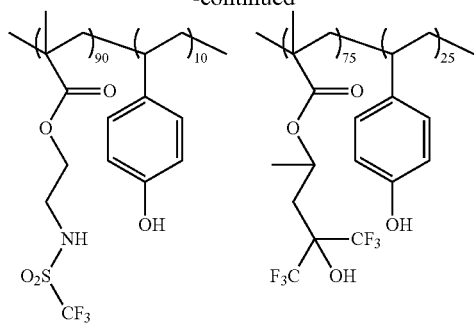
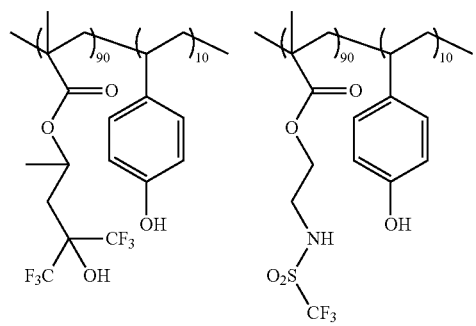
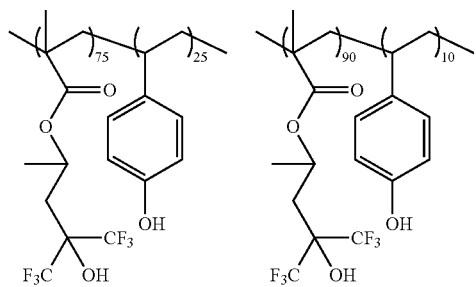
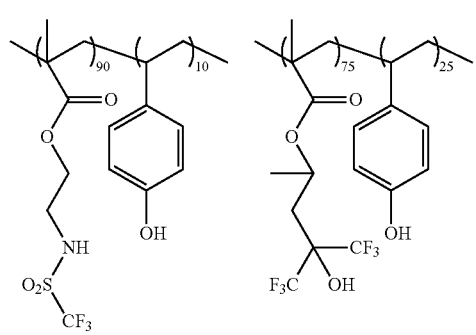
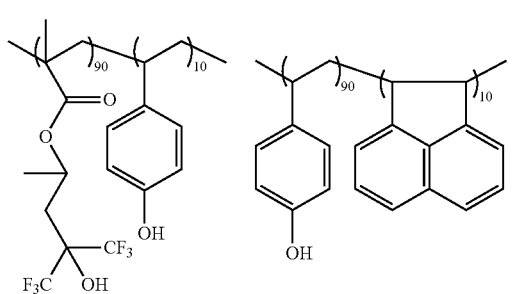
-continued
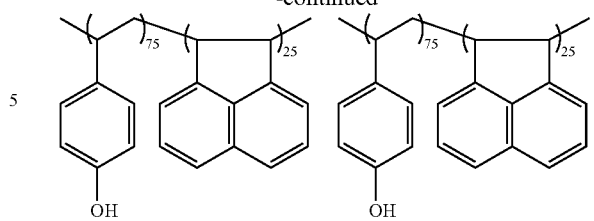
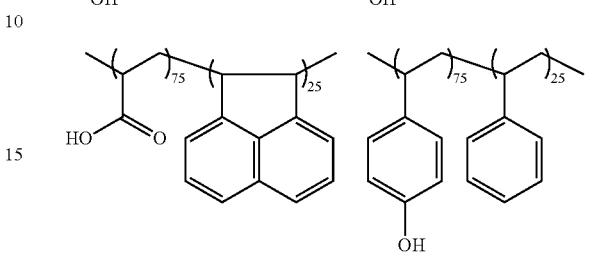
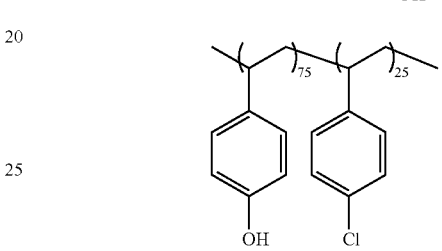
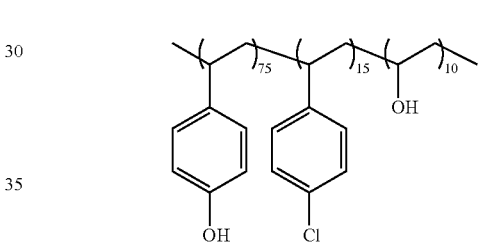
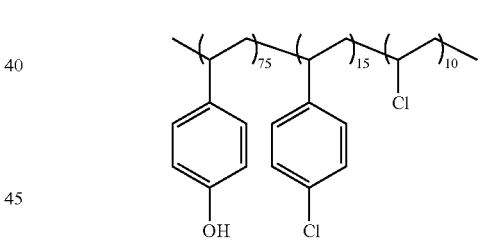
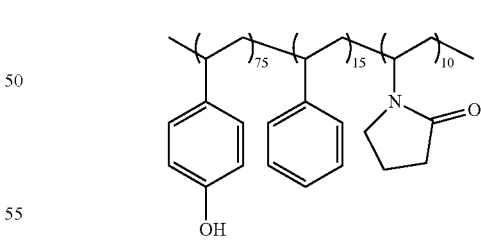
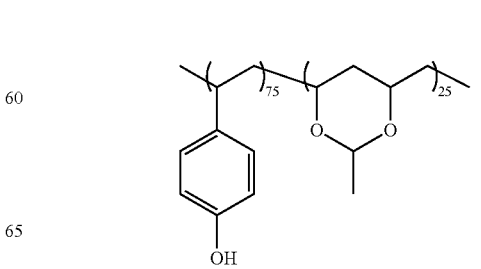

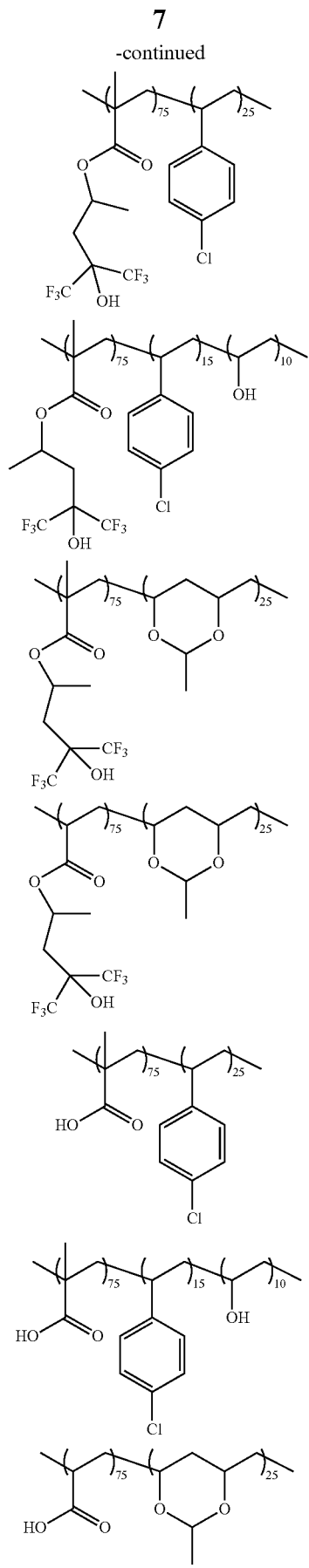
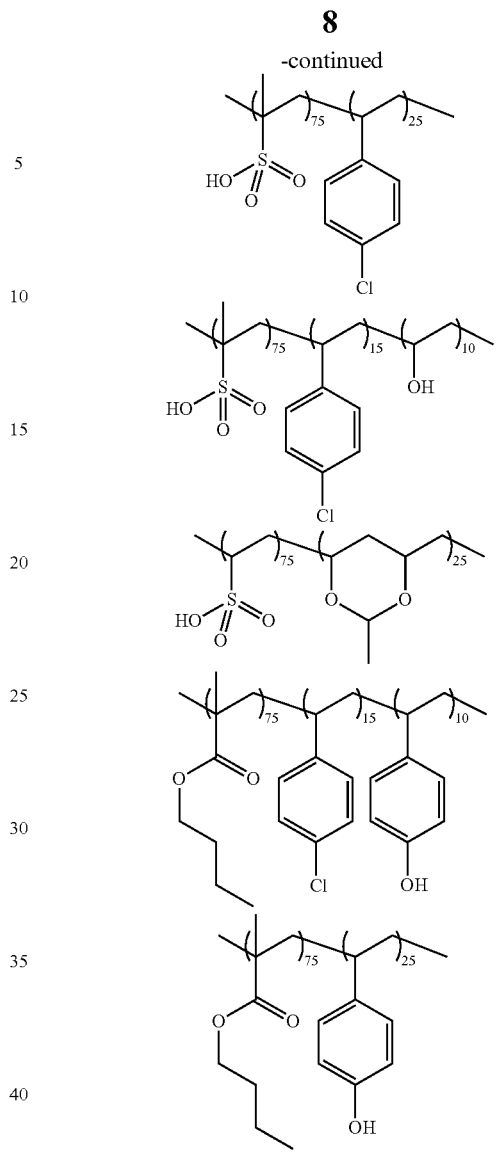

wherein the unit contents are in mol %.

The content of the matrix polymer in the composition will depend, for example, on the target thickness of the layer, with a higher polymer content being used when thicker layer is desired. The matrix polymer is typically present in the pattern overcoat composition in an amount of from 80 to 100 wt %, more typically from 90 to 100 wt %, 95 to 100 wt %, 99 to 100 wt %, or 100 wt %, based on total solids of the overcoat composition. The weight average molecular weight (Mw) of the matrix polymer is typically less than 400,000, preferably from 3000 to 50,000, more preferably from 3000 to 25,000, as measured by GPC versus polystyrene standards. Typically, the matrix polymer will have a polydispersity index (PDI=Mw/Mn) of 3 or less, preferably 2 or less, as measured by GPC versus polystyrene standards.

The overcoat compositions typically include a single polymer, but can optionally include one or more additional polymers. Suitable polymers and monomers for use in the overcoat compositions are commercially available and/or can readily be made by persons skilled in the art. For example, the matrix polymer may be synthesized by dissolving selected monomers corresponding to units of the polymer in an organic solvent, adding a radical polymerization initiator thereto, and effecting heat polymerization to form the polymer. Examples of suitable organic solvents that can be used for polymerization of the matrix polymer include, for example, toluene, benzene, tetrahydrofuran, diethyl ether and dioxane. Suitable polymerization initiators include, for example, 2,2'-azobisisobutyronitrile (AIBN), 2,2'-azobis(2,4-dimethylvaleronitrile), dimethyl 2,2-azobis (2-methylpropionate), benzoyl peroxide and lauroyl peroxide.

The overcoat compositions further include one or more solvents. Suitable solvent materials to formulate and cast the overcoat compositions exhibit very good solubility characteristics with respect to the non-solvent components of the overcoat composition, but do not appreciably dissolve the underlying photoresist pattern so as to minimize intermixing. The overcoat compositions are preferably organic solvent-based, meaning greater than 50 wt % organic solvents, and more typically greater than 90 wt %, greater than 95 wt %, greater than 99 wt % or 100 wt % organic solvents, based on the total solvents of the overcoat compositions.

The solvent comprises one or more ester solvents of the formula $R_1$—C(O)O—$R_2$, wherein $R_1$ is a C3-C6 alkyl group and $R_2$ is a C5-C10 alkyl group. Preferred such ester solvents include, for example, isoamyl isobutyrate, n-Pentyl isobutyrate, Isoamyl n-butyrate, n-Pentyl n-pentanoate, Iso-amyl isopentanoate, n-Hexyl isobutyrate, 2-Ethylhexyl isobutyrate, Isoamyl valerate, Isoamyl 2-methylvalerate and combinations of such ester solvents. Of these, Isoamyl isobutyrate is particularly preferred. The use of such an ester solvent is believed to contribute to improved LCDU as compared with an untreated resist pattern and lower defectivity than known resist pattern trimming compositions when treating vinyl aromatic-based photoresist patterns. Without wishing to be bound by any particular theory, it is believed that the polar nature of the ester solvent lends itself to these properties. The one or more ester solvent solvents of the above formula are typically present in a combined amount of from 1 to 100 wt %, preferably from 2 to 30 wt % or from 3 to 10 wt %, based on the total solvent of the overcoat composition.

The overcoat compositions may include one or more additional solvent types. For example, the overcoat compositions preferably further include one or more monoether solvents. If present in the compositions, the one or more monoether solvents are typically present in a combined amount of from 50 to 99 wt %, preferably 70 to 98 wt % or 90 to 97 wt %, based on total solvents of the overcoat composition. Use of a monoether-based solvent system can provide desirable (low) toploss characteristics when treating vinyl aromatic-based photoresist patterns.

Preferred monoether solvents include alkyl monoethers and aromatic monoethers, particularly preferred of which are those having a total carbon number of from 6 to 16. Suitable alkyl monoethers include, for example, 1,4-cineole, 1,8-cineole, pinene oxide, di-n-propyl ether, diisopropyl ether, di-n-butyl ether, di-n-pentyl ether, diisoamyl ether, dihexyl ether, diheptyl ether and dioctyl ether, with diisoamyl ether being preferred. Suitable aromatic monoethers include, for example, anisole, ethylbenzyl ether, diphenyl ether, dibenzyl ether and phenetole, with anisole being preferred.

Other suitable solvents for the overcoat compositions include one or more alcohol solvents. For certain overcoat compositions, an alcohol may provide enhanced solubility with respect to the solid components. Suitable alcohol solvents include, for example: straight, branched or cyclic C4-C8 monohydric alcohol such as 1-butanol, 2-butanol, isobutyl alcohol, tert-butyl alcohol, 3-methyl-1-butanol, 1-pentanol, 2-pentanol, 4-methyl-2-pentanol, 1-hexanol, 1-heptanol, 2-hexanol, 2-heptanol, 3-hexanol, 3-heptanal, 1-octanol, octanol, 3-octanol, 4-octanol, 2,2,3,3,4,4-hexafluoro-1-butanol, 2,2,3,3,4,4,5,5-octafluoro-1-pentanol and 2,2,3,3,4,4,5,5,6,6-decafluoro-1-hexanol; and C5-C9 fluorinated diols such as 2,2,3,3,4,4-hexafluoro-1,5-pentanediol, 2,2,3,3,4,4,5,5-octafluoro-1,6-hexanediol and 2,2,3,3,4,4,5,5,6,6,7,7-dodecafluoro-1,8-octanediol. The alcohol solvent is preferably a C4-C8 monohydric alcohol, with 4-methyl-2-pentanol being preferred. The one or more alcohol solvents if used in the overcoat compositions are typically present in a combined amount of less than 50 wt %, more typically in an amount of from 2 to 30 wt %, based on the total solvent of the overcoat composition.

The solvent system can include one or more additional solvents chosen, for example, from one or more of ketones such as 2,5-dimethyl-4-hexanone and 2,6-dimethyl-4-heptanone; aliphatic hydrocarbons such as n-heptane, 2-methylheptane, 3-methylheptane, 3,3-dimethylhexane, 2,3,4-trimethylpentane, n-octane, n-nonane, and n-decane; fluorinated aliphatic hydrocarbons such as perfluoroheptane; and diethers such as dipropylene glycol monomethyl ether. Such additional solvents, if used, are typically present in a combined amount of from 1 to 20 wt % based on the solvent system.

A particularly preferred solvent system includes the one or more ester solvents as described above in a combined amount of from 2 to 30 wt % and one or more ether solvents in a combined amount of from 70 to 98 wt %, based on the total solvent of the overcoat composition.

The one or more solvents are typically present in the overcoat composition in a combined amount of from 90 to 99 wt %, preferably from 95 to 99 wt %, based on the overcoat composition.

The overcoat compositions can optionally include an acid or an acid generator such as a thermal acid generator (TAG), or can be free of such components. In the case of a photoresist based on deprotection reaction, the acid or generated acid with heat can cause cleavage of the bonds of acid labile groups in a surface region of the photoresist pattern, causing increased solubility of the photoresist polymer in a developing solution to be applied. Inclusion of an acid or acid generator in the overcoat compositions can thereby allow for increased amount of resist removal from the surface of the resist pattern.

The acid may take the form of one or more acid groups (e.g., carboxylic acid or sulfonic acid group) on the matrix polymer. Acid group-containing units on the polymer can be present, for example, in an amount of 30 mol % or less, based on the matrix polymer.

Additionally or alternatively, the acid can be in non-polymeric form. Preferable non-polymeric acids are organic acids including both non-aromatic acids and aromatic acids optionally having fluorine substitution. Suitable organic acids include, for example: carboxylic acids and polycarboxylic acids such as alkanoic acids, including formic acid, acetic acid, propionic acid, butyric acid, dichloroacetic acid, trichloroacetic acid, perfluoroacetic acid, perfluorooctanoic acid, oxalic acid malonic acid and succinic acid; hydroxyalkanoic acids, such as citric acid; aromatic carboxylic acids such as benzoic acid, fluorobenzoic acid, hydroxybenzoic acid and naphthoic acid; organic phosphorus acids such as dimethylphosphoric acid and dimethylphosphinic acid; and sulfonic acids such as optionally fluorinated alkylsulfonic acids including methanesulfonic acid, trifluoromethanesulfonic acid, ethanesulfonic acid, 1-butanesulfonic acid, 1-perfluorobutanesulfonic acid, 1,1,2,2-tetrafluorobutane-1-sulfonic acid, 1,1,2,2-tetrafluoro-4-hydroxybutane-1-sulfonic acid, 1-pentanesulfonic acid, 1-hexanesulfonic acid, 1-heptanesulfonic acid, and the following:
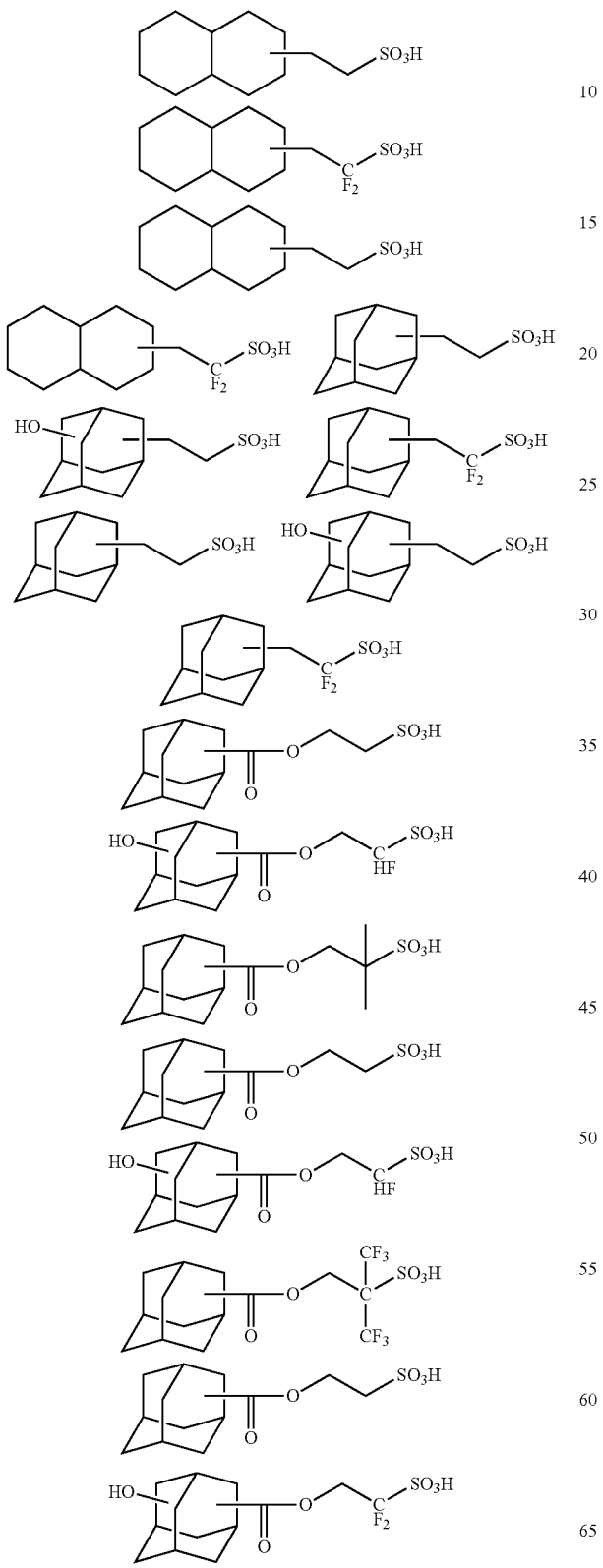
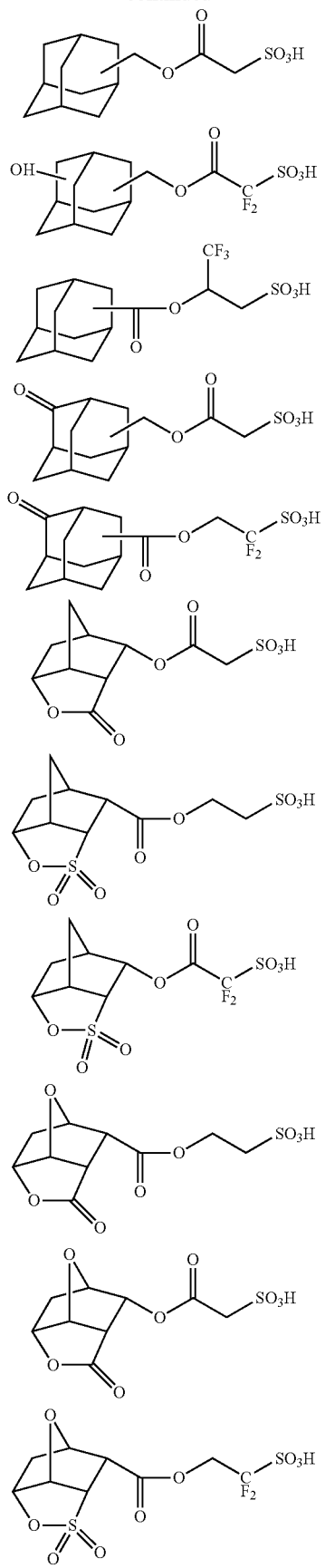

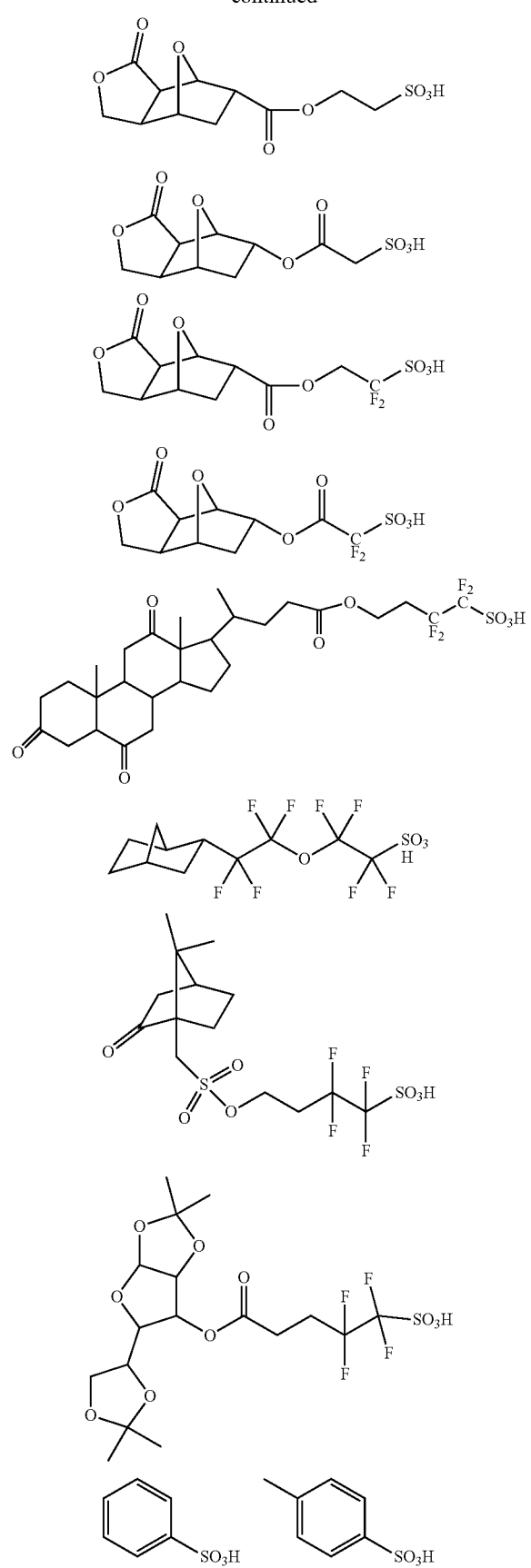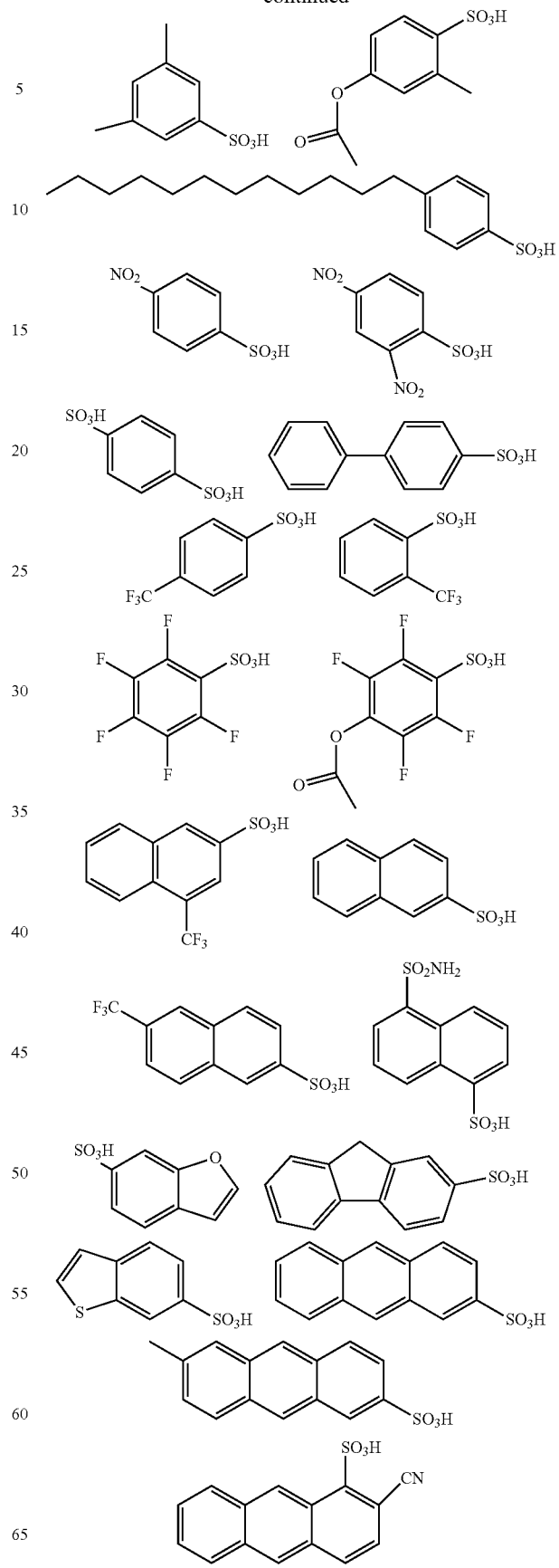

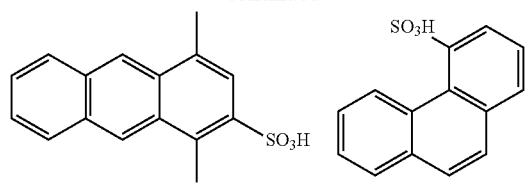
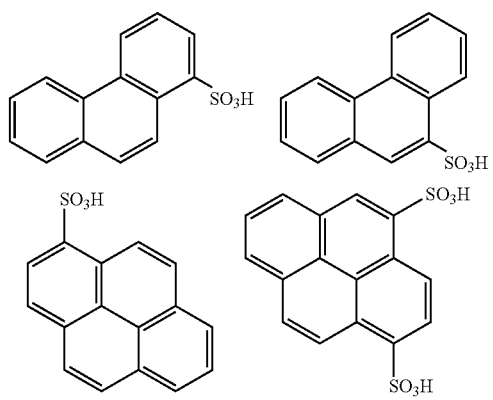
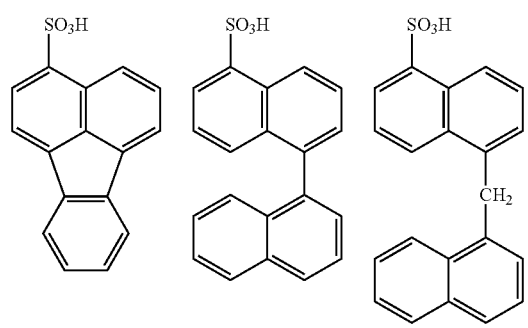
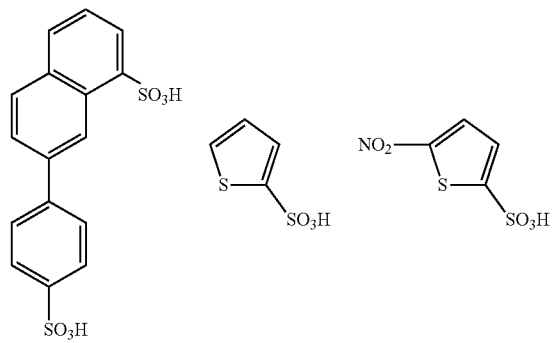
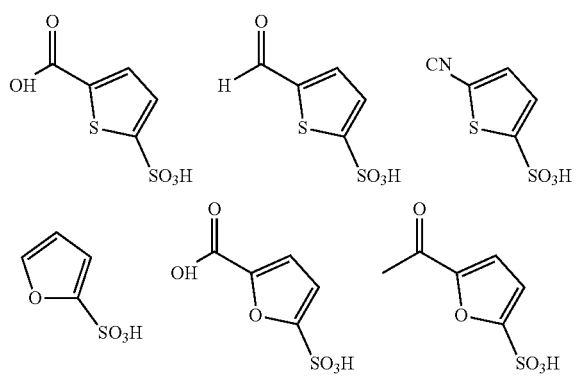
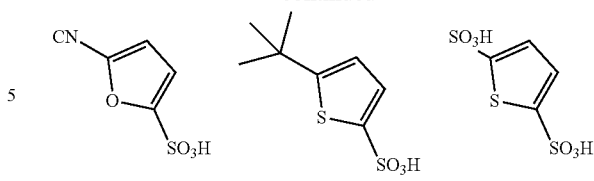
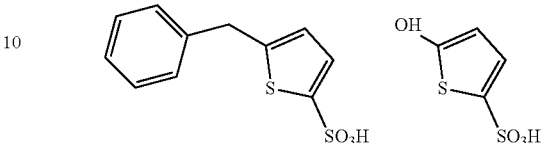
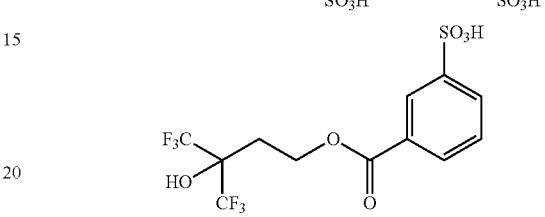
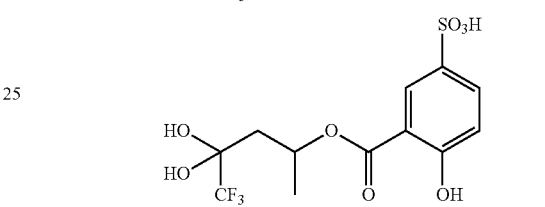
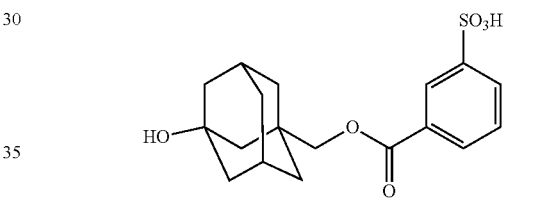
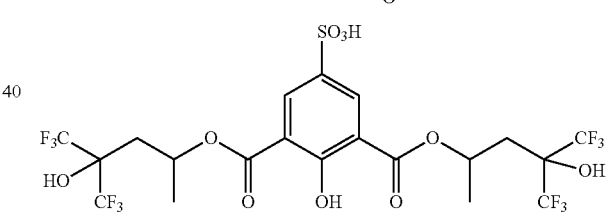
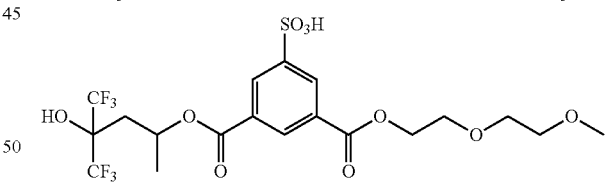
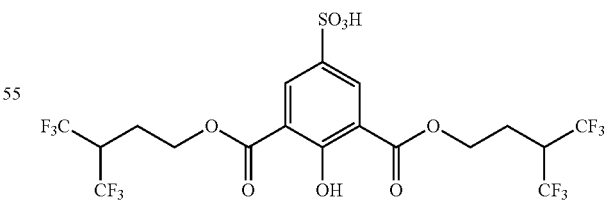
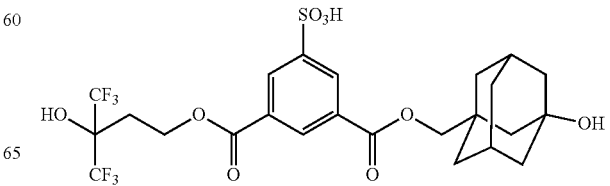

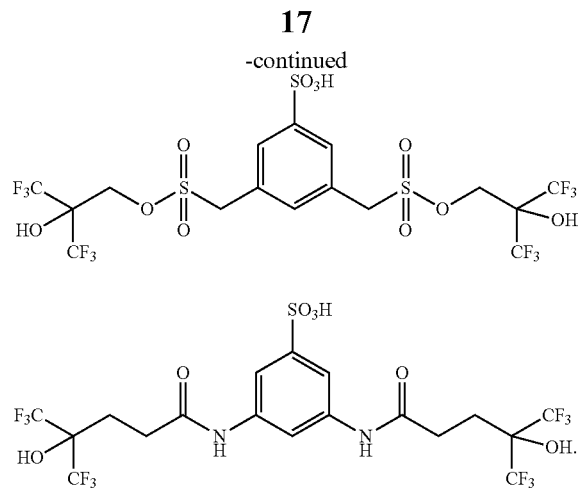

The non-polymeric acid when used on the overcoat compositions is typically present in an amount of from about 0.01 to 20 wt % based on total solids of the overcoat composition.

Suitable thermal acid generators include those capable of generating the non-polymeric acids described above. The thermal acid generator can be non-ionic or ionic. Preferably, the TAG is ionic with a reaction scheme for generation of a sulfonic acid as shown below:

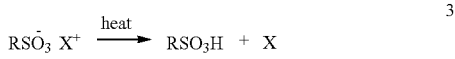

wherein $RSO_3^-$ is the TAG anion and $X^+$ is the TAG cation, preferably an organic cation. The cation can be a nitrogen-containing cation of the general formula (I):

$$(BH)^+ \quad\quad (I)$$

Which is the monoprotonated form of a nitrogen-containing base B. Suitable nitrogen-containing bases B include, for example: optionally substituted amines such as ammonia, difluoromethylammonia, C1-20 alkyl amines, and C3-30 aryl amines, for example, nitrogen-containing heteroaromatic bases such as pyridine or substituted pyridine (e.g., 3-fluoropyridine), pyrimidine and pyrazine; nitrogen-containing heterocyclic groups, for example, oxazole, oxazoline, or thiazoline. The foregoing nitrogen-containing bases B can be optionally substituted, for example, with one or more group chosen from alkyl, aryl, halogen atom (preferably fluorine), cyano, nitro and alkoxy. Of these, base B is preferably a heteroaromatic base.

Base B typically has a pKa from 0 to 5.0, or between 0 and 4.0, or between 0 and 3.0, or between 1.0 and 3.0. As used herein, the term "$pK_a$" is used in accordance with its art-recognized meaning, that is, $pK_a$ is the negative log (to the base 10) of the dissociation constant of the conjugate acid $(BH)^+$ of the basic moiety (B) in aqueous solution at about room temperature. In certain embodiments, base B has a boiling point less than about 170° C., or less than about 160° C., 150° C., 140° C., 130° C., 120° C., 110° C., 100° C. or 90° C.

Exemplary suitable nitrogen-containing cations $(BH)^+$ include $NH_4^+$, $CF_2HNH_2^+$, $CF_3CH_2NH_3^+$, $(CH_3)_3NH^+$, $(C_2H_5)_3NH^+$, $(CH_3)_2(C_2H_5)NH^+$ and the following:

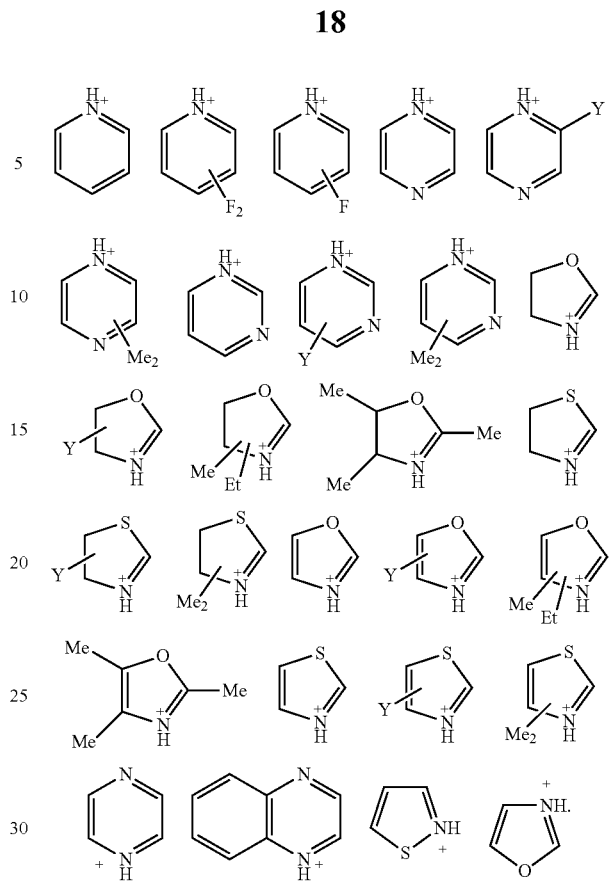

in which Y is alkyl, preferably, methyl or ethyl.

Other suitable cations include onium cations. Suitable onium cations include, for example, sulfonium and iodonium cations, for example, those of the following general formula (II):

wherein X is S or I, wherein when X is I then a is 2, and when X is S then a is 3; $R_3$ is independently chosen from organic groups such as optionally substituted $C_{1-30}$ alkyl, polycyclic or monocyclic $C_{3-30}$ cycloalkyl, polycyclic or monocyclic $C_{6-30}$ aryl, or a combination thereof, wherein when X is S, two of the $R_3$ groups together optionally form a ring.

Exemplary suitable sulfonium and iodonium cations include the following:

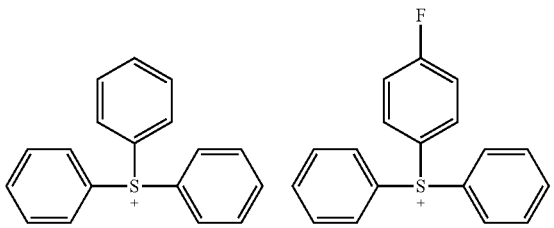

-continued

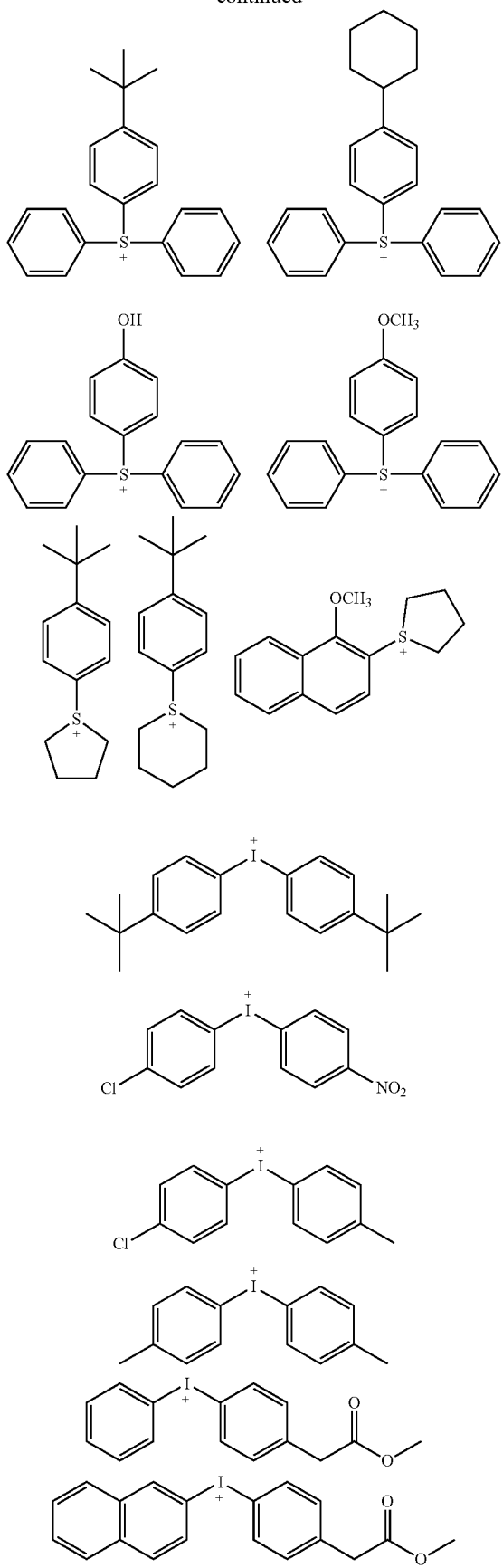

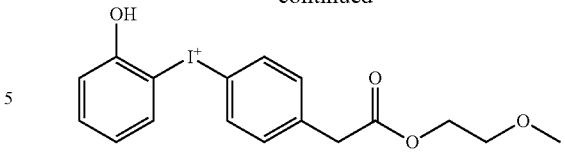

When present the acid generator is typically present in the composition in an amount of from about 0.01 to 20 wt % based on the total solids of the overcoat composition.

The overcoat composition can further include a surfactant. Typical surfactants include those which exhibit an amphiphilic nature, meaning that they can be both hydrophilic and hydrophobic at the same time. Amphiphilic surfactants possess a hydrophilic head group or groups, which have a strong affinity for water and a long hydrophobic tail, which is organophilic and repels water. Suitable surfactants can be ionic (i.e., anionic, cationic) or nonionic. Further examples of surfactants include silicone surfactants, poly (alkylene oxide) surfactants, and fluorochemical surfactants. Suitable non-ionic surfactants include, but are not limited to, octyl and nonyl phenol ethoxylates such as TRITON® X-114, X-100, X-45, X-15 and branched secondary alcohol ethoxylates such as TERGITOL™ TMN-6 (The Dow Chemical Company, Midland, Mich. USA). Still further exemplary surfactants include alcohol (primary and secondary) ethoxylates, amine ethoxylates, glucosides, glucamine, polyethylene glycols, polyethylene glycol-co-propylene glycol), or other surfactants disclosed in *McCutcheon's Emulsifiers and Detergents*, North American Edition for the Year 2000 published by Manufacturers Confectioners Publishing Co. of Glen Rock, N.J. Nonionic surfactants that are acetylenic diol derivatives also can be suitable. Such surfactants are commercially available from Air Products and Chemicals, Inc. of Allentown, Pa. and sold under the trade names of SURFYNOL® and DYNOL®. Additional suitable surfactants include other polymeric compounds such as the tri-block EO-PO-EO co-polymers PLURONIC® 25R2, L121, L123, L31, L81, L101 and P123 (BASF, Inc.). Such surfactant and other optional additives if used are typically present in the composition in minor amounts such as from 0.01 to 10 wt % based on total solids of the overcoat composition. The overcoat compositions are preferably free of cross-linking agents as such materials can result in a dimensional increase of the photoresist pattern.

The overcoat compositions can be prepared following known procedures. For example, the compositions can be prepared by dissolving solid components of the composition in the solvent components. The desired total solids content of the compositions will depend on factors such as the desired final layer thickness. Preferably, the solids content of the overcoat compositions is from 1 to 10 wt %, more preferably from 1 to 5 wt %, based on the total weight of the composition.

Photoresist Compositions

Photoresist compositions useful in the pattern formation methods are typically chemically amplified positive photoresist compositions suitable for KrF and/or EUV exposure. Preferred photoresist compositions include a vinyl aromatic-based matrix polymer such as a polyhydroxystyrene-based polymer. Preferred matrix polymers comprise a repeat unit of the following formula (III):

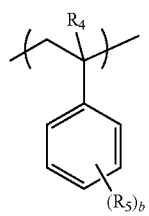

(III)

wherein: $R_4$ is hydrogen or methyl; $R_5$ is one or more groups chosen from hydroxyl, C1-C8 alkoxy, C5-C12 aryloxy, C2-C10 alkoxycarbonyloxy, C1-C4 alkyl, C5-C15 aryl and C6-C20 aralkyl, wherein one or more carbon hydrogens are optionally substituted with a halogen atom; b is an integer of from 1 to 5; wherein at least one $R_5$ is independently chosen from hydroxyl, C1-C8 alkoxy, C5-C12 aryloxy and C2-C10 alkoxycarbonyloxy.

The matrix polymer typically also includes repeat units having an acid labile leaving group, for example units of general formula (IV) in which the hydroxyl moiety of a carboxyl group is substituted with an acid labile group:

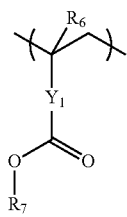

(IV)

wherein: $R_6$ represents hydrogen, C1-C4 alkyl or C1-C4 fluoroalkyl; $R_7$ represents an acid labile group; $Y_1$ is a single bond or a C1-C12 divalent linking group that optionally is halogenated or contains one or more of ester, ether or ketone groups.

Suitable acid labile groups for $R_7$ include, but are not limited to the following:

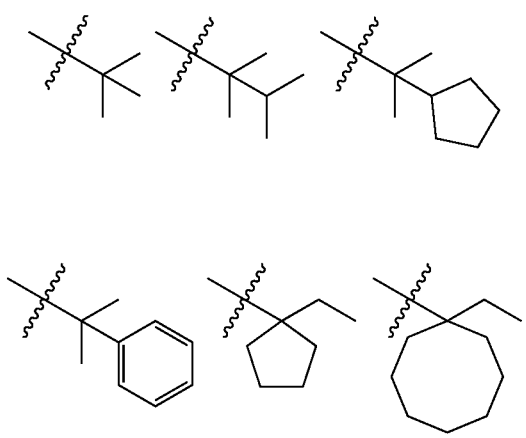

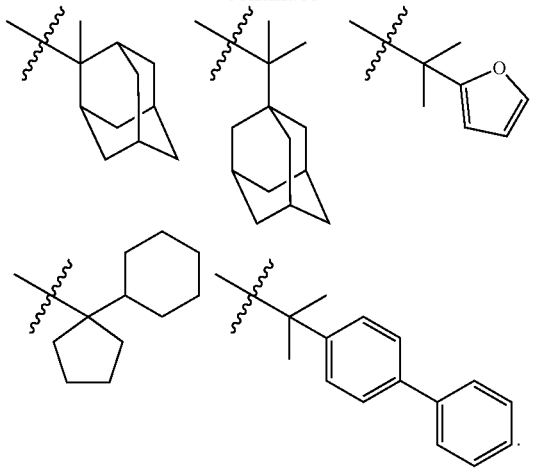

The photoresist matrix polymer may further comprise recurring units of an onium salt photoacid generator. Suitable such units include, for example, those of the general formulae (V) and (VI):

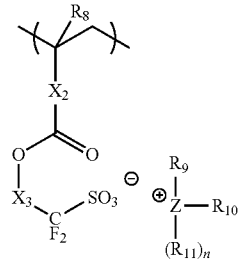

(V)

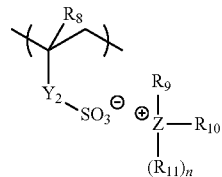

(VI)

In formulae (V) and (VI), $R_8$ represents hydrogen, C1-C4 alkyl or C1-C4 fluoroalkyl; $R_9$, $R_{10}$ and $R_{11}$ each independently represents a straight, branched or cyclic C1-C12 alkyl group which may contain a carbonyl, ester or ether substituent, or a C6-C12 amyl group, a C7-C20 aralkyl group or a thiophenyl group; $R_9$ and $R_{10}$ may connect to form single cyclic or fused cyclic structures; $X_2$ and $X_3$ each independently represent a single bond, a C1-C12 divalent linking group that optionally contains one or more of a halogen atom or a group chosen from ester, ether, ketone and aromatic; $Y_2$ represents a single bond, optionally fluorinated methylene or ethylene, optionally fluorinated phenylene, —$OR_{12}$—, or —$C(O)Y_3R_{12}$—, wherein $Y_3$ is oxygen or NH, and $R_{12}$ is a group chosen from straight, branched or cyclic C1-C6 alkylene, phenylene, fluorophenylene, trifluoromethyl-substituted phenylene or alkenylene, which may contain a carbonyl, ester, ether or hydroxyl substituent; Z represents S or I; n is an integer of 0 or 1, provided that when Z is S, n is 1 and when Z is I, n is 0.

Suitable exemplary sulfonium and iodonium PAG monomers for use in the photoresist matrix polymer include the following:

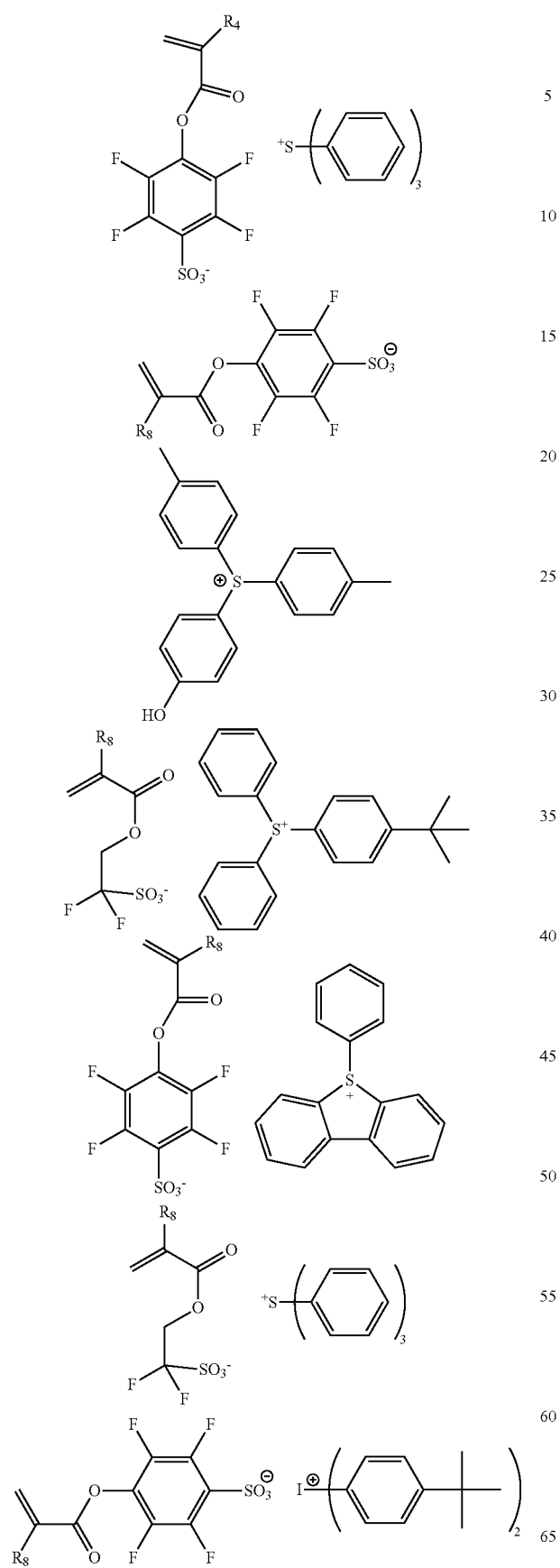

-continued

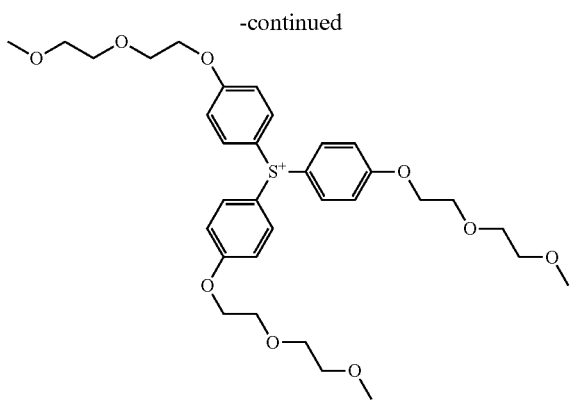

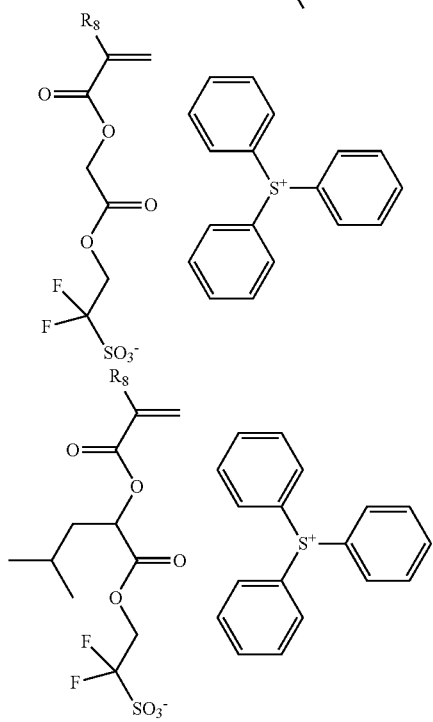

where $R_8$ represents hydrogen, C1-C4 alkyl or C1-C4 fluoroalkyl.

The matrix polymer may be synthesized using well known free radical polymerization techniques known in the art. For example, the polymer may be synthesized by dissolving the monomers in an organic solvent, adding a radical polymerization initiator thereto, and effecting heat polymerization to form the polymer. Suitable organic solvents that can be used for the polymerization include, for example, toluene, benzene, tetrahydrofuran, diethyl ether and dioxane. Suitable polymerization initiators include, for example, 2,2'-azobisisobutyronitrile (AIBN), 2,2'-azobis(2, 4-dimethylvaleronitrile), dimethyl 2,2-azobis(2-methylpropionate), benzoyl peroxide and lauroyl peroxide.

When copolymerizing certain hydroxy aromatic monomers such as hydroxystyrene or hydroxyvinylnaphthalene, an alternative polymerization method may be desired due to the relative instability of such monomers. The polymerization may, for example, take place using protected phenolic hydroxyl groups and subsequently deprotecting the polymer. For example, acetoxystyrene or acetoxyvinylnaphthalene monomers can be used in the polymerization instead of hydroxystyrene or hydroxyvinylnaphthalene. After polymerization, the acetoxy group can then be deprotected by acid or alkaline hydrolysis to convert those units to hydroxystyrene or hydroxyvinylnaphthalene units.

Typically, the copolymer will have a Mw of from 1,000 to 50,000, more typically from 10,000 to 30,000 with a typical polydispersity index (PDI=Mw/Mn) of 3 or less, preferably 2 or less, as measured by GPC versus polystyrene standards.

The preferred resist compositions further comprise an additive photoacid generator that does not form part of the matrix polymer. The additive PAG can be ionic or non-ionic. Suitable additive PAGs are described, for example, in U.S. Pat. No. 7,704,668B1, U.S. Pat. No. 9,182,669B2 and U.S. Pat. No. 6,740,467B2, and also include the following exemplary compounds:

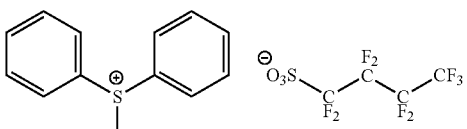

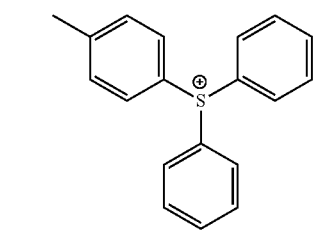

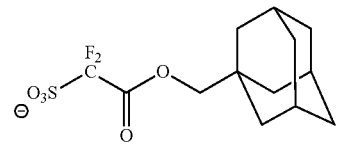

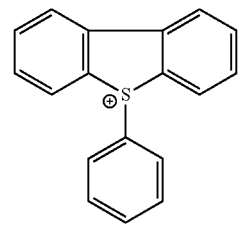

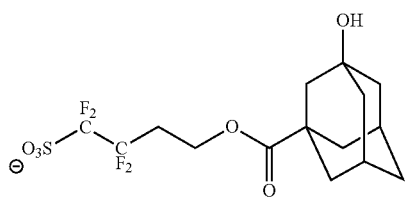

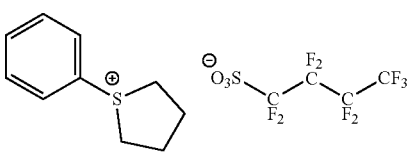

-continued

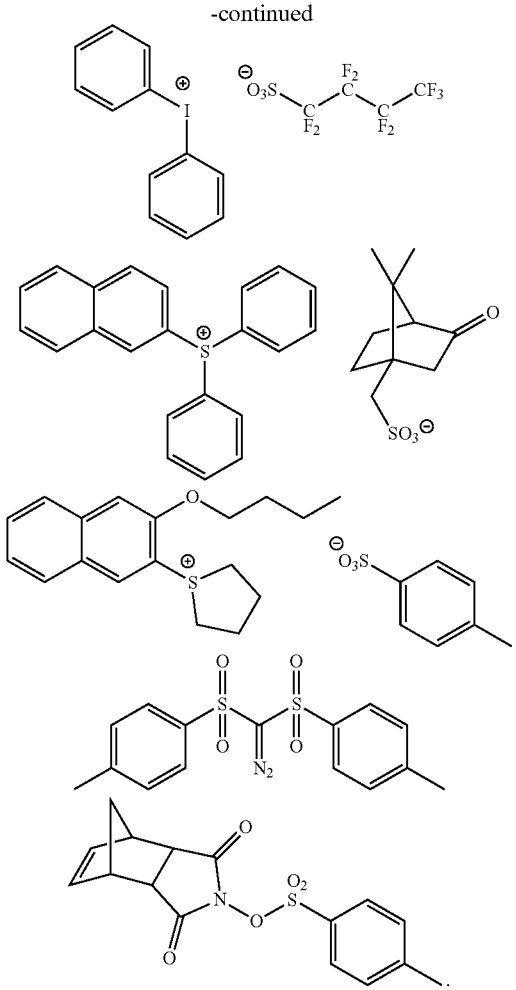

The photoresist compositions can include one or more other optional materials, for example, added bases, surfactants, actinic and contrast dyes, anti-striation agents, plasticizers, speed enhancers and sensitizers. Such optional additives typically will be present in minor concentration in the photoresist compositions except for fillers and dyes which may be present in relatively large concentrations such as, e.g., in amounts of from 5 to 30 percent by weight of the total weight of a resist's dry components.

The photoresist compositions can be prepared following known procedures. For example, the compositions can be prepared by dissolving solid components of the composition in the solvent components. The desired total solids content of the compositions will depend on factors such as the desired final layer thickness. Typically, the solids content of the photoresist compositions is from 5 to 35 wt % based on the total weight of the composition.

Pattern Formation Methods

Processes in accordance with the invention will now be described with reference to FIG. 1A-H, which illustrates an exemplary process flow for a pattern formation method in accordance with the invention. While the illustrated process flow describes a patterning process in which a single resist mask is used to transfer the photoresist pattern to the underlying substrate, it should be clear that the method can be used in other lithographic processes, for example, in double patterning processes such as litho-litho-etch (LLE), litho-etch-litho-etch (LELE) or self-aligned double patterning (SADP), as an ion implantation mask, or any other lithographic process where such photoresist pattern treatment would be beneficial. Also, while FIG. 1A depicts in cross-section a substrate 100 which may include various layers and features. The substrate can be of a material such as a semiconductor, such as silicon or a compound semiconductor (e.g., III-V or II-VI), glass, quartz, ceramic, copper and the like. Typically, the substrate is a semiconductor wafer, such as single crystal silicon or compound semiconductor water, and may have one or more layers and patterned features formed on a surface thereof. One or more layers to be patterned 102 may be provided over the substrate 100. Optionally, the underlying base substrate material itself may be patterned, for example, when it is desired to form trenches in the substrate material. In the case of patterning the base substrate material itself, the pattern shall be considered to be formed in a layer of the substrate.

The layers may include, for example, one or more conductive layers such as layers of aluminum, copper, molybdenum, tantalum, titanium, tungsten, alloys, nitrides or silicides of such metals, doped amorphous silicon or doped polysilicon, one or more dielectric layers such as layers of silicon oxide, silicon nitride, silicon oxynitride, or metal oxides, semiconductor layers, such as single-crystal silicon, and combinations thereof. The layers to be etched can be formed by various techniques, for example, chemical vapor deposition (CVD) such as plasma-enhanced CVD, low-pressure CVD or epitaxial growth, physical vapor deposition (PVD) such as sputtering or evaporation, or electroplating. The particular thickness of the one or more layers to be etched 102 will vary depending on the materials and particular devices being formed.

Depending on the particular layers to be etched, film thicknesses and photolithographic materials and process to be used, it may be desired to dispose over the layers 102 a hard mask layer 103 and/or a bottom antireflective coating (BARC) 104 over which a photoresist layer 106 is to be coated. Use of a hard mask layer may be desired, for example, with very thin resist layers, where the layers to be etched require a significant etching depth, and/or where the particular etchant has poor resist selectivity. Where a hard mask layer is used, the resist patterns to be formed can be transferred to the hard mask layer 103 which, in turn, can be used as a mask for etching the underlying layers 102. Suitable hard mask materials and formation methods are known in the art. Typical materials include, for example, tungsten, titanium, titanium nitride, titanium oxide, zirconium oxide, aluminum oxide, aluminum oxynitride, hafnium oxide, amorphous carbon, silicon oxynitride and silicon nitride. The hard mask layer can include a single layer or a plurality of layers of different materials. The hard mask layer can be formed, for example, by chemical or physical vapor deposition techniques.

A bottom antireflective coating may be desirable where the substrate and/or underlying layers would otherwise reflect a significant amount of incident radiation during photoresist exposure such that the quality of the formed pattern would be adversely affected. Such coatings can improve depth-of-focus, exposure latitude, linewidth uniformity and CD control. Antireflective coatings are typically used where the resist is exposed to deep ultraviolet light (300 nm or less), for example, KrF (248 nm). ArF (193 nm) and EUV (13.5 nm). The antireflective coating can comprise a single layer or a plurality of different layers. Suitable antireflective materials and methods of formation are known in the art. Antireflective materials are commercially available, for example, those sold under the AR™ trademark by Rohm and Haas Electronic Materials LLC (Marlborough, Mass. USA), such as AR™ 40A and AR™ 124 antireflectant materials.

A photoresist layer 106 as described herein is formed from a photoresist material, typically a chemically amplified photosensitive composition, comprising a matrix polymer having acid labile groups. The photoresist layer is disposed on the substrate over the antireflective layer 104 (if present). The photoresist composition can be applied to the substrate by spin-coating, dipping, roller-coating or other conventional coating technique. Of these, spin-coating is typical. For spin-coating, the solids content of the coating solution can be adjusted to provide a desired film thickness based upon the specific coating equipment utilized, the viscosity of the solution, the speed of the coating tool and the amount of time allowed for spinning. A typical thickness for the photoresist layer 106 is from about 500 to 3000 Å.

The photoresist layer 106 can next be softbaked to minimize the solvent content in the layer, thereby forming a tack-free coating and improving adhesion of the layer to the substrate. The softbake can be conducted on a hotplate or in an oven, with a hotplate being typical. The softbake temperature and time will depend, for example, on the particular material of the photoresist and thickness. Typical softbakes are conducted at a temperature of from about 90 to 150° C. and a time of from about 30 to 90 seconds.

The photoresist layer 106 is next exposed to activating radiation 108 through a photomask 110 to create a difference in solubility between exposed and unexposed regions. References herein to exposing a photoresist composition to radiation that is activating for the composition indicates that the radiation is capable of forming a latent image in the photoresist composition. The photomask has optically transparent and optically opaque regions corresponding to regions of the resist layer to be exposed and unexposed, respectively, by the activating radiation. The exposure wavelength is typically sub-400 nm, sub-300 nm, such as 248 nm or an EUV wavelength (e.g., 13.5 nm), with 248 nm and EUV wavelengths being preferred. The exposure energy is typically from about 10 to 80 mJ/cm$^2$, dependent upon the exposure tool and the components of the photosensitive composition.

Following exposure of the photoresist layer 106, a post-exposure bake (PEB) is typically performed. The PEB can be conducted, for example, on a hotplate or in an oven. Conditions for the PEB will depend, for example, on the particular photoresist composition and layer thickness. The PEB is typically conducted at a temperature of from about 80 to 150° C., and a time of from about 30 to 90 seconds. A latent image defined by the boundary between polarity-switched and unswitched regions (corresponding to exposed and unexposed regions, respectively) is thereby formed.

The photoresist layer 106 is next developed to remove exposed regions of the layer, leaving unexposed regions forming a resist pattern 106' having a plurality of features as shown in FIG. 19. The features are not limited and can include, for example, a plurality of lines and/or contact hole patterns which allow for the formation of such patterns in the underlying layers to be patterned. The formed patterns have an initial dimension shown as $L_1$, a linewidth in the case of line patterns or post diameter for post patterns.

Figure 1E:
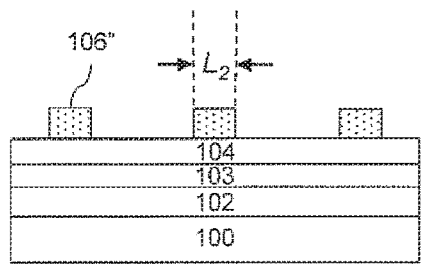
Figure 1B:
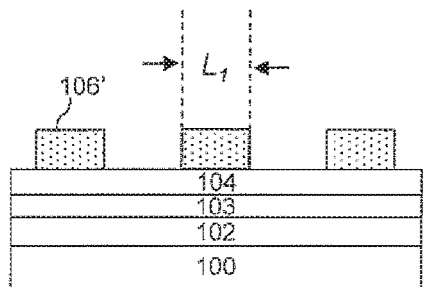
Figure 1F:
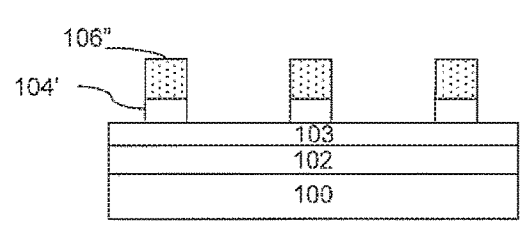
Figure 1C:
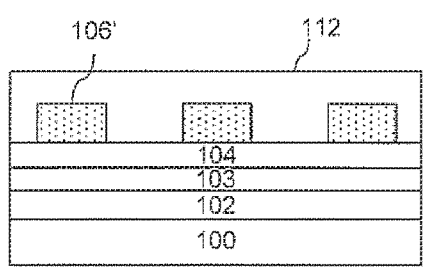

A layer 112 of a photoresist pattern overcoat composition as described herein is formed over the photoresist pattern 106' as shown in FIG. 1C. The overcoat composition is typically applied to the substrate by spin-coating. The solids content of the coating solution can be adjusted to provide a desired film thickness based upon the specific coating equipment utilized, the viscosity of the solution, the speed of the coating tool and the amount of time allowed for spinning. A typical thickness for the pattern overcoat layer 112 is from 200 to 1500 Å, typically measured on an unpatterned substrate.

Figure 1G:
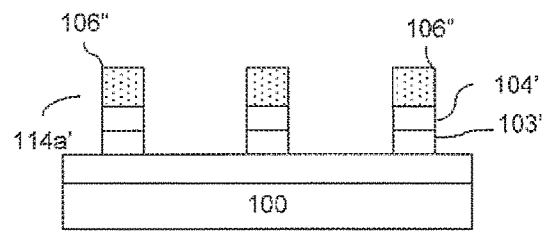
Figure 1D:
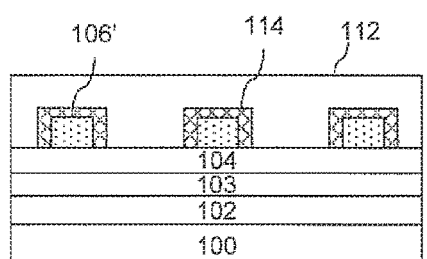

As shown in FIG. 1D, the substrate is next baked to remove solvent in the overcoat composition layer. The bake can also activate an optionally included thermal acid generator and allow the generated acid, or an optional free acid, to diffuse into the surface of the resist pattern 106' to cause a polarity-changing reaction in the resist pattern surface region 114. The bake can be conducted with a hotplate or oven, with a hotplate being typical. Suitable bake temperatures are greater than 50° C., for example, greater than 70° C., greater than 90° C., greater than 120° C. or greater than 150° C., with a temperature of from 70 to 160° C. and a time of from about 30 to 90 seconds being typical. While a single baking step is typical, multiple-step baking can be used and may be useful for resist profile adjustment.

The photoresist pattern is next contacted with a rinsing agent, typically a developing solution, to remove the residual overcoat composition layer 112 and typically also the surface region 114 of the photoresist pattern, with the resulting pattern 106" being shown in FIG. 1E. The rinsing agent is typically an aqueous alkaline developer, for example, a quaternary ammonium hydroxide solution, for example, a tetra-alkyl ammonium hydroxide solutions such as 0.26 Normality (N) (2.38 wt %) tetramethylammonium hydroxide (TMAH). The rinsing agent can further be or comprise water. The resulting structure is shown in FIG. 1E. The resist pattern after overcoat treatment has a dimension ($L_2$) that is smaller as compared with the feature size prior to overcoat treatment.

Figure 1H:
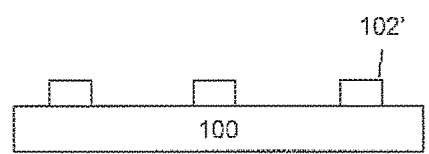

Using the resist pattern 106" as an etch mask, the BARC layer 104 is selectively etched to form BARC patterns 104', exposing the underlying hardmask layer 103, as shown in FIG. 1F. The hardmask layer is next selectively etched, again using the resist pattern as an etch mask, resulting in patterned BARC and hardmask layer 103', as shown in FIG. 1G. Suitable etching techniques and chemistries for etching the BARC layer and hardmask layer are known in the art and will depend, for example, on the particular materials of these layers. Dry-etching processes such as reactive ion etching are typical. The resist pattern 106" and patterned BARC layer 104' are next removed from the substrate using known techniques, for example, oxygen plasma aching. Using the hardmask pattern 103' as an etch mask, the one or more layers 102 are then selectively etched. Suitable etching techniques and chemistries for etching the underlying layers 102 are known in the art, with dry-etching processes such as reactive ion etching being typical. The patterned hardmask layer 103' can next be removed from the substrate surface using known techniques, for example, a dry-etching process such as reactive ion etching or a wet strip. The resulting structure is a pattern of etched features 102' as illustrated in FIG. 1H. In an alternative exemplary method, it may be desirable to pattern the layer 102 directly using the photoresist pattern 106" without the use of a hardmask layer 103. Whether direct patterning with the resist patterns can be employed will depend on factors such as the materials involved, resist selectivity, resist pattern thickness and pattern dimensions.

The following non-limiting examples are illustrative of the invention.

EXAMPLES

Polymer Synthesis

The following monomers were used to synthesize polymers according to the procedures described below:

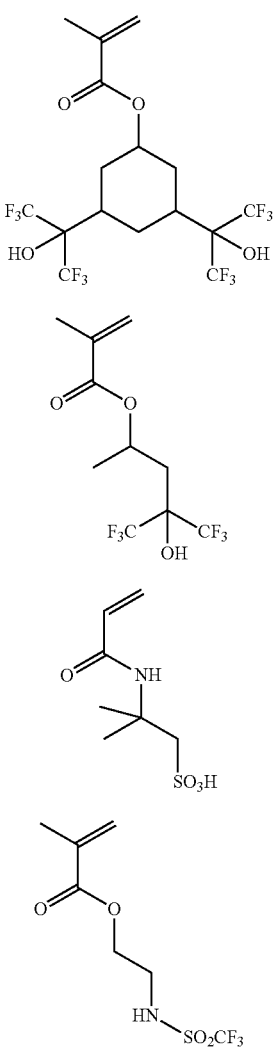

Polymer P1 Synthesis

A monomer feed solution was prepared by combining 23.77 g propylene glycol monomethyl ether (PGME) and 22.80 g monomer M1 in a container and agitating the mixture to dissolve the monomer. 1.92 g monomer M3 was dissolved in 1.92 g of distilled water in a container and the mixture was agitated to dissolve the monomer. This monomer (M3) solution was added to and mixed with the reaction mixture. An initiator feed solution was prepared by combining 0.39 g Vazo 67 free radical initiator (E. I. du Pont de Nemours and Company) and 3.53 g of PGME in a container and agitating the mixture to dissolve the initiator. 27.11 g of PGME was introduced into a reaction vessel and the vessel was purged with nitrogen gas for 30 minutes. The reaction vessel was next heated to 90° C. with agitation. Introduction of the monomer feed solution and initiator feed solution into the reaction vessel was simultaneously started. The monomer feed solution was fed over a period of 2 hours and the initiator feed solution was fed over a period of 3 hours. The reaction vessel was maintained at 90° C. for an additional 7 hours with agitation, and was then allowed to cool to room temperature. The reaction mixture was precipitated in water (1000 mL) to yield polymer P1 as a white solid which was further dried under vacuum at 40° C. Polymer P1 was thereby formed. Weight average molecular weight (Mw) and polydispersity (PDI=Mw/Mn) were determined by polystyrene equivalent value as measured by gel permeation chromatography (GPC). [Mw=10735 Daltons, PDI=1.81].

Polymer P2 Synthesis

A monomer teed solution was prepared by combining 10.88 g PGME and 30.40 g monomer M2 in a container and agitating the mixture to dissolve the monomer. 2.56 g monomer M3 was dissolved in 2.56 a of distilled water in a container and the mixture was agitated to dissolve the monomer. This monomer (M3) solution was added to and mixed with the reaction mixture. An initiator feed solution was prepared by combining 1.23 g Vazo 67 free radical initiator (E. I. du Pont de Nemours and Company) and 11.05 g of PGME in a container and agitating the mixture to dissolve the initiator. 23.24 g of PGME was introduced into a reaction vessel and the vessel was purged with nitrogen gas for 30 minutes. The reaction vessel was next heated to 90° C. with agitation. Introduction of the monomer feed solution and initiator feed solution into the reaction vessel was simultaneously started. The monomer feed solution was fed over a period of 2 hours and the initiator feed solution was fed over a period of 3 hours. The reaction vessel was maintained at 90° C. for an additional 7 hours with agitation, and was then allowed to cool to room temperature. The reaction mixture was precipitated in water (1000 mL) to yield polymer P2 as a white solid which was further dried wider vacuum at 40° C. Polymer P2 was thereby formed. Weight average molecular weight (Mw) and polydispersity (PDI=Mw/Mn) were determined by polystyrene equivalent value as measured by gel permeation chromatography (GPC). [Mw=17374 Daltons, PDI=2.42].

Polymer P3 Synthesis

A monomer feed solution was prepared by mixing 23.67 g 4-methyl-2-pentanol (MIBC), 15.80 g Monomer M2 and 1.76 g Monomer M4 in a container and agitating the mixture to dissolve the two monomers. An initiator feed solution was prepared by combining 0.53 g Vazo-67 free radical initiator (E. I. du Pont de Nemours and Company) and 17.03 g of MIBC in a container and agitating the mixture to dissolve the initiator. 41.23 g of MIBC was introduced into a reaction vessel and the vessel was purged with nitrogen gas for 30 minutes. The reaction vessel was next heated to 90° C. with agitation. Introduction of the monomer feed solution and initiator feed solution into the reaction vessel was simultaneously started. The monomer feed solution was fed over a period of 2 hours and the initiator feed solution was fed over a period of 3 hours. The reaction vessel was maintained at 90° C. for an additional 7 hours with agitation, and was then allowed to cool to room temperature. The resulting polymer solution was precipitated in heptane (2000 mL) to yield polymer P3 as a white solid which was further dried under vacuum at 40° C. Polymer P3 was thereby formed. Weight average molecular weight (Mw) and polydispersity (PDI=Mw/Mn) were determined by polystyrene equivalent value as measured by gel permeation chromatography (GPC). [Mw=12316 Daltons, PDI=2.28].

Polymer P4 Synthesis

A monomer feed solution was prepared by mixing 9.85 g MIBC and 45.00 g Monomer M2 in a container. An initiator feed solution was prepared by combining 1.76 g Vazo-67 free radical initiator (E. I. du Pont de Nemours and Company) and 15.88 g of MIBC in a container and agitating the mixture to dissolve the initiator. 27.50 g of MIBC was introduced into a reaction vessel and the vessel was purged with nitrogen gas for 30 minutes. The reaction vessel was next heated to 90° C. with agitation. Introduction of the monomer feed solution and initiator feed solution into the reaction vessel was simultaneously started. The monomer feed solution was fed over a period of 2 hours and the initiator feed solution was fed over a period of 3 hours. The reaction vessel was maintained at 90° C. for an additional 7 hours with agitation, and was then allowed to cool to room temperature. The resulting polymer solution was precipitated in heptane (2000 mL) to yield polymer P4 as a white solid which was further dried under vacuum at 40° C. Polymer P4 was thereby formed. Weight average molecular weight (Mw) and polydispersity (PDI=Mw/Mn) were determined by polystyrene equivalent value as measured by gel permeation chromatography (GPC). [Mw=15966 Daltons, PDI=1.93].

Polymer P5 Synthesis

A monomer feed solution was prepared by mixing 13.91 g MIBC and 36.00 g Monomer M1 in a container. An initiator feed solution was prepared by combining 0.81 g Vazo-67 free radical initiator (E. I. du Pont de Nemours and Company) and 7.2.8 g of MIBC in a container and agitating the mixture to dissolve the initiator. 22.00 g of MIBC was introduced into a reaction vessel and the vessel was purged with nitrogen gas for 30 minutes. The reaction vessel was next heated to 90° C. with agitation. Introduction of the monomer feed solution and initiator feed solution into the reaction vessel was simultaneously started. The monomer feed solution was fed over a period of 2 hours and the initiator teed solution was fed over a period of 3 hours. The reaction vessel was maintained at 90° C. for an additional 7 hours with agitation, and was then allowed to cool to room temperature. The resulting polymer solution was precipitated in heptane (2000 mL) to yield polymer P5 as a white solid which was further dried under vacuum at 40° C. Polymer P5 was thereby formed. Weight average molecular weight (Mw) and polydispersity (PDI=Mw/Mn) were determined by polystyrene equivalent value as measured by gel permeation chromatography (GPC). [Mw=19515 Daltons, PDI=1.90].

Preparation of Pattern Overcoat Compositions (PUC)

Photoresist pattern overcoat compositions were prepared by dissolving respective polymers in solvents using the materials and amounts set forth in Table 1. The resulting mixtures were shaken on a mechanical shaker for 3 to 24 hours and then filtered through a Teflon filter having a 0.2 micron pore size.

TABLE 1

| Example | Pattern Overcoat Composition | Polymer (wt %) | Solvent (wt %) | | | |
|---|---|---|---|---|---|---|
| | | | S1 | S2 | S3 | S4 |
| Ex. 1 | POC-1 | P1 (5) | 9.5 | 85.5 | | |
| Ex. 2 | POC-2 | P2 (5) | 9.5 | 85.5 | | |
| Ex. 3 | POC-3 | P3 (5) | 9.5 | 85.5 | | |
| Ex. 4 | POC-4 | P1 (5) | 28.5 | 66.5 | | |
| Ex. 5 | POC-5 | P2 (5) | 28.5 | 66.5 | | |
| Ex. 6 | POC-6 | P3 (5) | 28.5 | 66.5 | | |
| Ex. 7 | POC-7 | P1 (5) | 95 | | | |
| Ex. 8 | POC-8 | P2 (5) | 95 | | | |
| Ex. 9 | POC-9 | P3 (5) | 95 | | | |
| Ex. 10 | POC-10 | P1 (5) | 9.5 | 80.8 | 4.7 | |
| Ex. 11 | POC-11 | P2 (5) | 9.5 | 80.8 | 4.7 | |
| Ex. 12 | POC-12 | P3 (5) | 9.5 | 80.8 | 4.7 | |
| Ex. 13 | POC-13 | P2 (3.3) | 82.2 | | 4.8 | 9.7 |
| Ex. 14 | POC-14 | P4 (3.3) | 19.3 | 77.4 | | |
| Ex. 15 | POC-15 | P4 (2.9) | 9.7 | 87.4 | | |
| Comp. 1 | POC-16 | P1 (5) | | 95 | | |
| Comp. 2 | POC-17 | P2 (5) | | 95 | | |
| Comp. 3 | POC-18 | P3 (5) | | 95 | | |

TABLE 1-continued

| Example | Pattern Overcoat Composition | Polymer (wt %) | Solvent (wt %) | | | |
|---|---|---|---|---|---|---|
| | | | S1 | S2 | S3 | S4 |
| Comp. 4 | POC-19 | P4 (3.3) | 4.8 | | 91.9 | |
| Comp. 5 | POC-20 | P4 (3.3) | | 96.7 | | |
| Comp. 6 | POC-21 | P4 (2.9) | | 85.4 | 8.7 | 2.9 |
| Comp. 7 | POC-22 | P5 (3.3) | | 96.7 | | |

S1 = Isoamyl isobutyrate;
S2 = Isoamyl ether;
S3 = Methyl isobutyl carbinol;
S4 = Dipropyleneglycol monomethyl ether;
all amounts provided as weight percent (wt %) based on total pattern overcoat composition.

Solubility Test

The polymers and solvents in the amounts shown in Table 2 were mixed and hand-shaken in a 20 mL glass container for 1 minute. Turbidity was then measured with an Orbeco-Hellige 965-10 Turbidimeter. The results are shown in Table 2, wherein "O" indicates a good solubility with a turbidity of less than or equal to 1; and "X" indicates poor solubility with a turbidity of greater than 1.

TABLE 2

| Example | Polymer (wt %) | Solvent (wt %) | | | Solubility |
|---|---|---|---|---|---|
| | | S1 | S2 | S3 | |
| Ex. 16 | P1 (5) | 9.5 | 85.5 | | O |
| Ex. 17 | P2 (5) | 9.5 | 85.5 | | O |
| Ex. 18 | P3 (5) | 9.5 | 85.5 | | O |
| Ex. 19 | P1 (5) | 28.5 | 66.5 | | O |
| Ex. 20 | P2 (5) | 28.5 | 66.5 | | O |
| Ex. 21 | P3 (5) | 28.5 | 66.5 | | O |
| Ex. 22 | P1 (5) | 95 | | | O |
| Ex. 23 | P2 (5) | 95 | | | O |
| Ex. 24 | P3 (5) | 95 | | | O |
| Ex. 25 | P1 (5) | 9.5 | 80.8 | 4.7 | O |
| Ex. 26 | P2 (5) | 9.5 | 80.8 | 4.7 | O |
| Ex. 27 | P3 (5) | 9.5 | 80.8 | 4.7 | O |
| Comp. 8 | P1 (5) | | 95 | | X |
| Comp. 9 | P2 (5) | | 95 | | X |
| Comp. 10 | P3 (5) | | 95 | | X |

S1 = Isoamyl isobulyrate;
S2 = Isoamyl ether;
S3 = Methyl isobulyl catbinol;
all amounts provided as weight percent (wt %) based on total pattern overcoat composition.

Photoresist Pattern Overcoat Composition Evaluation
Lithography and CD Evaluation 200 mm silicon wafers were coated with AR™3-600 organic bottom anti-reflective coating material (Dow Electronic Materials) to a thickness of 600 Å. The wafers were baked at 205° C. for 60 seconds. UV™1610 polyhydroxystyrene-based photoresist (Dow Electronic Materials) was coated over the wafers using a TEL ACTS clean track. The waters were softbaked at 120° C. for 60 seconds to give target thickness of 862 Å. The coated wafers were exposed to KrF (248 nm) radiation on a CANON FPA-5000 ES4 DUV scanner with NA=0.68, conventional illumination (Sigma, 0.75) using a binary reticle with 175 nm diameter 1:1 dense contact hole patterns. The wafers were post-exposure baked at 130° C. for 60 seconds and developed using 0.26 N aqueous TMAH solution for 50 seconds. CDs of the resist patterns of one of the wafers were measured using a Hitachi High Technologies Co. CG4000 CD-SEM to obtain initial CD measurements. 20 CD measurements were made on each of 5 SEM images across a single die of the wafer. Wafers were next coated with a respective pattern overcoat composition as indicated in Table 3, baked at 100°

C. for 60 seconds and rinsed using 0.26 N aqueous TMAH solution for 20 seconds. CDs of the resist patterns for the treated wafers were then measured as described above. The change in CD (ΔCD) for the treated patterns was calculated according to the following equation:

ΔCD=CD$_f$-CD$_i$ wherein CD$_f$ is the average CD measurement after overcoat treatment, and CD$_i$ is the average CD measurement prior to overcoat treatment. The percentage change in local CD uniformity (ΔLCDU %) of the resist patterns was calculated based on the standard deviation of the CD measurements according to the following equation:

ΔLCDU (%)=[(LCDU$_f$-LCDU$_i$)/LCDU$_i$]·100 wherein LCDU$_i$ is the standard deviation of the CD measurements prior to overcoat treatment and LCDU$_f$ is the standard deviation of the CD measurements after overcoat treatment. The results are shown in Table 3.

TABLE 3

| Example | Pattern Overcoat Composition | Polymer (wt %) | Solvent (wt %) | | | ΔCD (nm) | ΔLCDU (%) |
|---|---|---|---|---|---|---|---|
| | | | S1 | S2 | S3 | | |
| Ex. 28 | POC-13 | P2 (3.3) | 82.2 | 9.7 | 4.8 | 7.5 | 34 |
| Ex. 29 | POC-14 | P4 (3.3) | 19.3 | 77.4 | | 17.1 | 13 |
| Comp. 11 | POC-19 | P4 (3.3) | 4.8 | | 91.9 | 8.6 | 0 |
| Comp. 12 | POC-20 | P4 (3.3) | | 96.7 | | 7.5 | 5 |

S1 = Isoamyl isobutyrate;
S2 = Isoamyl ether;
S3 = Methyl isobutyl carbinol;
all amounts provided as weight percent (wt %) based on total pattern overcoat composition.

Coating Defect Test

Pattern overcoat compositions were spin-coated at 1500 rpm on respective 200 mm Si wafers. The coated wafers were baked at 80° C. for 60 seconds. The wafers were then inspected on a KLA-Tencor 2800/Surfscan SP2 wafer surface inspection system. The results are shown in Table 4 wherein each Total Defect result represents a separate wafer tested.

TABLE 4

| Example | Pattern Overcoat Composition | Polymer (wt %) | Solvent (wt %) | | | | Total Defects | |
|---|---|---|---|---|---|---|---|---|
| | | | S1 | S2 | S3 | S4 | | |
| Ex. 30 | POC-13 | P2 (3.3) | 82.2 | 9.7 | 4.8 | | 71 | 55 |
| Ex. 31 | POC-15 | P4 (2.9) | 9.7 | 87.4 | | | 14 | 9 |
| Comp. 13 | POC-19 | P4 (3.3) | 4.8 | | 91.9 | | 1020 | 5842 |
| Comp. 14 | POC-20 | P4 (3.3) | | 96.7 | | | 9853 | 9195 |
| Comp. 15 | POC-21 | P4 (2.9) | | 85.4 | 8.7 | 2.9 | >50k | |
| Comp. 16 | POC-22 | P5 (3.3) | | 96.7 | | | 1327 | 443 |

S1 = Isoamyl isobutyrate;
S2 = Isoamyl ether;
S3 = Methyl isobutyl carbinol;
S4 = Dipropyleneglycol monomethyl ether;
all amounts provided as weight percent (wt %) based on total pattern overcoat composition.

What is claimed is:

1. A pattern formation method, comprising:
   (a) providing a semiconductor substrate;
   (b) forming a photoresist pattern over the semiconductor substrate, wherein the photoresist pattern is formed from a photoresist composition comprising: a first polymer comprising acid labile groups; and a photoacid generator;
   (c) coating a pattern overcoat composition over the photoresist pattern, wherein the pattern overcoat composition comprises a second polymer and a plurality of organic solvents comprising one or more ester solvents and one or more monoether solvents, wherein the ester solvent is of the formula R$_1$—C(O)O—R$_2$, wherein R$_1$ is a C3-C6 alkyl group and R$_2$ is a C5-C10 alkyl group;
   (d) baking the coated photoresist pattern; and
   (e) rinsing the coated photoresist pattern with a rinsing agent to remove the second polymer.

2. The method of claim 1, wherein the first polymer comprises a repeat unit of the following formula (III):

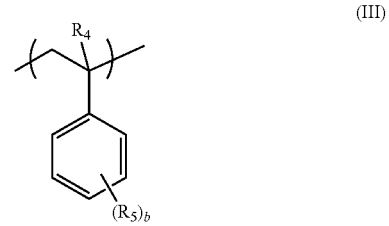

(III)

wherein: R$_4$ is hydrogen or methyl; R$_5$ is one or more groups chosen from hydroxyl, C1-C8 alkoxy, C5-C12 aryloxy, C2-C10 alkoxycarbonyloxy, C1-C4 alkyl, C5-C15 aryl and C6-C20 aralkyl, wherein one or more carbon hydrogens are optionally substituted with a halogen atom; b is an integer of from 1 to 5; wherein at least one R$_5$ is independently chosen from hydroxyl, C1-C8 alkoxy, C5-C12 aryloxy and C2-C10 alkoxycarbonyloxy.

3. The method of claim 1, wherein the ester solvent is isoamyl isobutyrate.

4. The method of claim 1, wherein the pattern overcoat composition further comprises an alcohol solvent.

5. The method of claim 1, wherein the second polymer comprises a repeat unit comprising a —C(CF$_3$)$_2$OH group and/or a repeat unit comprising an acid group.

6. The method of claim 1, wherein the pattern overcoat composition is free of non-polymeric acids and non-polymeric acid generators.

7. The method of claim 1, wherein the rinsing agent is an aqueous tetramethylammonium hydroxide solution.

8. The method of claim 1, wherein forming the photoresist pattern comprises exposing a layer formed from the photoresist composition to EUV radiation.

* * * * *